United States Patent
Kitahara et al.

(10) Patent No.: US 9,030,032 B2
(45) Date of Patent: May 12, 2015

(54) SEMICONDUCTOR DEVICE WITH PEELING PREVENTION MARKS AND SHIELD FILM

(75) Inventors: Takashi Kitahara, Kanagawa (JP); Hiroshi Koguma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 158 days.

(21) Appl. No.: 13/471,939

(22) Filed: May 15, 2012

(65) Prior Publication Data

US 2012/0295668 A1  Nov. 22, 2012

(30) Foreign Application Priority Data

May 18, 2011  (JP) .................... 2011-111193

(51) Int. Cl.
| | | |
|---|---|---|
| H01L 23/544 | (2006.01) | |
| H01L 23/552 | (2006.01) | |
| H01L 23/31 | (2006.01) | |
| H01L 21/56 | (2006.01) | |
| H01L 23/00 | (2006.01) | |
| H01L 25/065 | (2006.01) | |

(52) U.S. Cl.
CPC ............ *H01L 23/544* (2013.01); *H01L 23/552* (2013.01); *H01L 2223/54406* (2013.01); *H01L 2223/54433* (2013.01); *H01L 2223/54486* (2013.01); *H01L 23/3107* (2013.01); *H01L 21/565* (2013.01); *H01L 23/3121* (2013.01); *H01L 21/561* (2013.01); *H01L 24/97* (2013.01); *H01L 25/0655* (2013.01); *H01L 2224/32225* (2013.01); *H01L 2224/48227* (2013.01); *H01L 2224/73265* (2013.01); *H01L 2224/97* (2013.01); *H01L 2924/01029* (2013.01); *H01L 2924/1815* (2013.01); *H01L 2924/19105* (2013.01); *H01L 2924/13091* (2013.01); *H01L 2224/45144* (2013.01); *H01L 2224/45164* (2013.01); *H01L 2924/3011* (2013.01); *H01L 24/45* (2013.01); *H01L 2924/30107* (2013.01); *H01L 2924/3025* (2013.01); *H01L 2924/1306* (2013.01)

(58) Field of Classification Search
USPC ............... 257/704, 708, 730, 797, E23.123, 257/E23.127–E23.13, E23.179
See application file for complete search history.

(56) References Cited

U.S. PATENT DOCUMENTS

| | | | | |
|---|---|---|---|---|
| 6,743,975 | B2 * | 6/2004 | Kolb | 174/350 |
| 6,841,424 | B2 * | 1/2005 | Bolken | 438/127 |
| 7,670,940 | B2 * | 3/2010 | Mizukoshi et al. | 438/613 |
| 8,247,889 | B2 * | 8/2012 | Liao et al. | 257/659 |
| 2010/0078833 | A1 * | 4/2010 | Nakazato et al. | 257/787 |
| 2011/0127642 | A1 * | 6/2011 | Zhang et al. | 257/618 |

FOREIGN PATENT DOCUMENTS

JP  2005-109306 A  4/2005

\* cited by examiner

*Primary Examiner* — Matthew E Warren
(74) *Attorney, Agent, or Firm* — Mattingly & Malur, P.C.

(57) ABSTRACT

Provided is a technology capable of inhibiting a shield film formed over a surface of a sealing body from peeling from the surface of the sealing body, and inhibiting a part of the shield film from bulging from the surface of the sealing body. The present invention is characterized in that a peeling-prevention-mark formation region is provided so as to surround a product-identification-mark formation region, and a plurality of peeling prevention marks are formed in the peeling-prevention-mark formation region. That is, the present invention is characterized in that the region of the surface region of the sealing body which is different from the product-identification-mark formation region is defined as the peeling-prevention-mark formation region, and the peeling prevention marks are formed in the peeling-prevention-mark formation region.

12 Claims, 25 Drawing Sheets

SEMICONDUCTOR DEVICE WITH PEELING PREVENTION MARKS AND SHIELD FILM

CROSS-REFERENCE TO RELATED APPLICATIONS

The disclosure of Japanese Patent Application No. 2011-111193 filed on May 18, 2011 including the specification, drawings and abstract is incorporated herein by reference in its entirety.

BACKGROUND

The present invention relates to a semiconductor device, a manufacturing technique therefor, and a mobile telephone, and particularly to a technology which is effective when applied to a semiconductor device including a shield film.

In Japanese Unexamined Patent Publication No. 2005-109306 (Patent Document 1), a technique is described in which an etching treatment is performed on a surface of a sealing body forming a package to thereby improve the adhesion between the sealing body and an electroless copper plating coating formed over the surface of the sealing body.

RELATED ART DOCUMENT

Patent Document

[Patent Document 1]
Japanese Unexamined Patent Publication No. 2005-109306

SUMMARY

In recent years, mobile communication equipment (e.g., a mobile telephone) using a communication system represented by a GSM (Global System for Mobile Communications) (registered trademark) system, a PCS (Personal Communication Systems) system, a PDC (Personal Digital Cellular) system, a CDMA (Code Division Multiple Access) system, or the like has been globally prevalent.

In general, in a mobile telephone, a baseband signal processed in a baseband unit is modulated to a transmission signal (radio frequency signal) in an RFIC 5, and the power of the transmission signal resulting from the modulation is amplified in a power amplifier. Then, the transmission signal is radiated as a radio wave from an antenna via a transmission filter in which the transmission band is the passband. On the other hand, a reception signal received by the antenna is inputted to a low noise amplifier via a reception filter in which the reception band is the passband. In the low noise amplifier, the reception signal is amplified, and the amplified reception signal is demodulated to the baseband signal in the RFIC 5. Thereafter, the demodulated baseband signal is processed in the baseband unit. In this manner, the mobile telephone can perform transmission/reception.

As described above, in the mobile telephone, the power amplifier is used to amplify the power of the transmission signal. The power amplifier has a semiconductor chip formed with, e.g., an LDMOSFET as a power transistor. The semiconductor chip is mounted over a wiring board to form a power amplifying module including the power amplifier. The power amplifying module handles high power, and therefore serves as a large generation source of an electromagnetic wave. Accordingly, to inhibit the electromagnetic wave generated in the power amplifying module from affecting another semiconductor device mounted in the mobile telephone, it has been practiced to form a shield film over a surface of a package forming the power amplifying module. That is, by forming the shield film electrically coupled to a reference potential (GND potential) over a surface of a sealing body forming the package, it is possible to inhibit the electromagnetic wave generated in the power amplifying module from leaking to the outside, and also inhibit an electromagnetic wave existing outside from entering the power amplifying module.

However, as a result of conducting study, the present inventors have found that the shield film formed over the surface of the sealing body (encapsulating body) peels from the surface of the sealing body, resulting in a problem that a part of the shield film bulges (rises) from the surface of the sealing body.

An object of the present invention is to provide a technique which can inhibit a shield film formed over a surface of a sealing body from peeling from the surface of the sealing body, and inhibit a part of the shield film from bulging from the surface of the sealing body.

The above and other objects and novel features of the present invention will become apparent from a statement in the present specification and the accompanying drawings.

The following is a brief description of the outline of a representative aspect of the invention disclosed in the present application.

A semiconductor device according to a representative embodiment includes a sealing body in which a semiconductor chip mounted over a surface of a wiring board and the like are molded. At this time, there are formed a product identification mark having a recessed shape, and a shield film over a surface of the sealing body. There is also formed a peeling prevention mark having a recessed shape for preventing the shield film from peeling from the surface of the sealing body.

In a method of manufacturing a semiconductor device according to a representative embodiment, after a sealing body is formed over a wiring board so as to cover a semiconductor chip, a product identification mark having a recessed shape and a peeling prevention mark having a recessed portion are formed in a surface of the sealing body. Then, using a first blade, the sealing body is cut, and the wiring board is subjected to halfway dicing. In this manner, a reference wiring line is exposed from a side surface of the wiring board, and then a shield film is formed over the exposed side surface of the wiring board and the surface of the sealing body. Subsequently, by dicing using a second blade thinner than the first blade, the wiring board is cut.

In a method of manufacturing a semiconductor device according to a representative embodiment, after a sealing body is formed over a wiring board so as to cover a semiconductor chip, a product identification mark having a recessed shape is formed in a surface of the sealing body. Then, using a first blade, the sealing body is cut, and the wiring board is subjected to halfway dicing to expose a reference wiring line from a side surface of the wiring board. In addition, a shield film is formed over the exposed side surface of the wiring board and the surface of the sealing body, and then the wiring board is cut by dicing using a second blade thinner than the first blade. The step of forming the sealing body includes the steps of sandwiching the wiring board over which a semiconductor chip is mounted between an upper mold die provided with a protruding portion and a lower mold die so as to dispose the semiconductor chip in a cavity formed between the upper mold die and the lower mold die, and injecting a resin into the cavity so as to form the sealing body covering the semiconductor chip. At this time, in the surface of the sealing body, a peeling prevention mark having a recessed shape reflecting a shape of the protruding portion is formed.

A mobile telephone according to a representative embodiment has a power amplifying module including a power amplifier. The power amplifying module includes a sealing body in which a semiconductor chip mounted over a surface of a wiring board and the like are molded. A surface of the sealing body is formed with a product identification mark having a recessed shape for identification of a product and a peeling prevention mark having a recessed shape for preventing a shield film formed over the surface of the sealing body from peeling from the surface of the sealing body.

The following is a brief description of an effect obtained according to the representative aspect of the invention disclosed in the present application.

It is possible to inhibit the shield film formed over the surface of the sealing body from peeling from the surface of the sealing body, and inhibit a part of the shield film from bulging from the surface of the sealing body.

DETAILED DESCRIPTION

Figure 1:
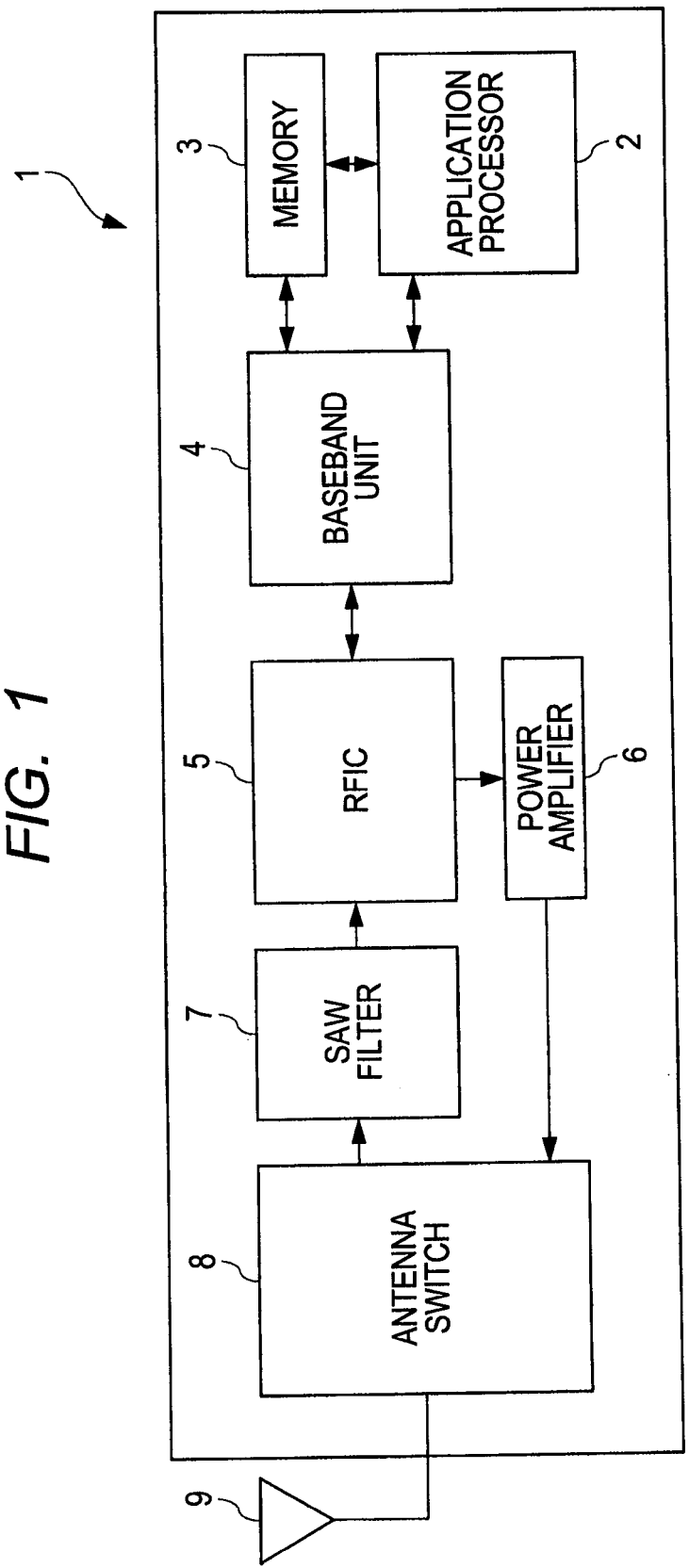
FIG. 1 is a block diagram showing a configuration of a transmission/reception portion of a mobile telephone.

In the following embodiments, if necessary for the sake of convenience, the embodiment will be described by being divided into a plurality of sections or embodiments. However, they are by no means irrelevant to each other unless particularly explicitly described otherwise, and one of the sections or embodiments is variations, details, supplementary explanation, and so forth of part or the whole of the others.

Also, in the following embodiments, when the number and the like (including the number, numerical value, amount, range, and the like) of elements are mentioned in the following embodiments, they are not limited to the specific numbers unless particularly explicitly described otherwise or unless they are obviously limited to the specific numbers in principle. The number and the like of the elements may be not less than or not more than the specific numbers.

It will be appreciated that, in the following embodiments, the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are mentioned in the following embodiments, the shapes and the like are assumed to include those substantially proximate or similar thereto unless particularly explicitly described otherwise or unless it can be considered that they obviously do not in principle. The same shall apply in regard to the foregoing numerical value and range.

Throughout the drawings for illustrating the embodiments, like members will be provided with like reference numerals in principle, and a repeated description thereof will be omitted. Note that even a plan view may be hatched for clarity of illustration.

First Embodiment

<Configuration and Operation of Mobile Telephone>

FIG. 1 is a block diagram showing a configuration of a transmission/reception portion of a mobile telephone. As shown in FIG. 1, a mobile telephone 1 includes an application processor 2, a memory 3, a baseband unit 4, an RFIC 5, a power amplifier 6, a SAW (Surface Acoustic Wave) filter 7, an antenna switch 8, and an antenna 9.

The application processor 2 includes a plurality of circuits of, e.g., a CPU (Central Processing Unit), an image processing unit, a music processing unit, and the like, and has the function of implementing the application function of the mobile telephone 1. Specifically, the application processor 2 reads out an instruction from the memory 3, interprets the instruction, and performs various arithmetic operations and control operations based on the result of the interpretation to thereby implement the application function. The memory 3 has the function of storing data, and is configured to store, e.g., a program for operating the application processor 2 and data processed in the application processor 2. The memory 3 is also adapted to be capable of accessing not only the application processor 2, but also the baseband unit 4 and being used for the storage of data processed in the baseband unit 4.

The baseband unit 4 is configured to be capable of digital processing of a voice signal (analog signal) from a user (calling party) via an operation portion and generating a baseband signal during transmission. The baseband unit 4 is also configured to be capable of reversely generating the voice signal from the baseband signal, which is a digital signal, during reception.

The RFIC 5 is configured to be capable of modulating the baseband signal during transmission to generate a signal at a radio frequency, and demodulating a reception signal during reception to generate the baseband signal. The power amplifier 6 is a circuit which newly generates a high-power signal analogous to an extremely weak input signal using power supplied from a power source, and outputs the high-power signal. The SAW filter 7 is configured to allow only that one of reception signals belonging to a predetermined frequency band to pass therethrough.

The antenna switch 8 is for separating reception signals inputted to the mobile telephone 1 from transmission signals outputted from the mobile telephone 1. The antenna 9 is for transmitting/receiving a radio wave.

The mobile telephone 1 is configured as described above, and the operation thereof will be briefly described below. First, the description will be given to the case of transmitting a signal. The baseband signal generated by subjecting an analog signal such as the voice signal to digital processing in the baseband unit 4 is inputted to the RFIC 5. The RFIC 5 converts the baseband signal inputted thereto to a signal at a radio frequency (RF) by means of a modulation signal source and a mixer. The signal at the radio frequency resulting from the conversion is outputted from the RFIC 5 to the power amplifier 6. The signal at the radio frequency inputted to the power amplifier 6 is amplified therein, and then transmitted from the antenna 9 via the antenna switch 8.

Next, a description will be given to the case of receiving a signal. The signal (reception signal) at the radio frequency received by the antenna 9 passes through the SAW filter 7, and is then inputted to the RFIC 5. In the RFIC 5, the inputted reception signal is amplified, and then subjected to frequency conversion by means of the modulation signal source and the mixer. Then, the signal subjected to the frequency conversion is detected, and the baseband signal is extracted. Thereafter, the baseband signal is outputted from the RFIC 5 to the baseband unit 4. The baseband signal is processed in the baseband unit 4, and the voice signal is outputted.

As described above, when a signal is transmitted from the digital mobile telephone, the signal is amplified by the power amplifier 6, and then outputted from the antenna 9 via the antenna switch 8.

<Circuit Block Configuration of Power Amplifier>

Figure 2:
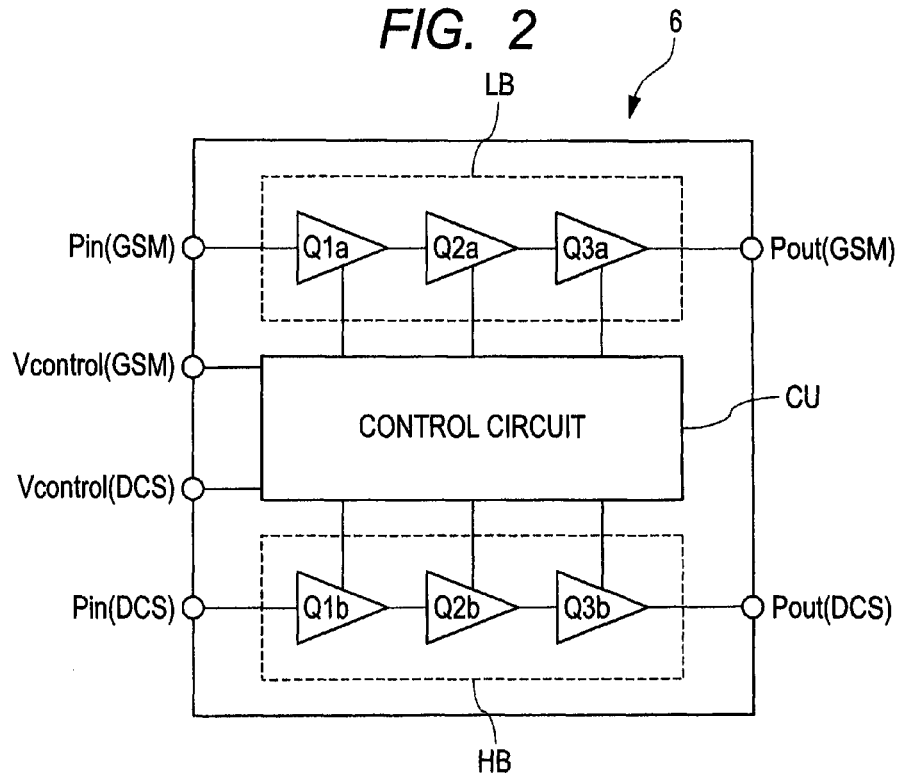
FIG. 2 shows circuit blocks in a power amplifier in a first embodiment.

A description will be given below to a circuit block configuration of the power amplifier 6 described above. FIG. 2 shows circuit blocks in the power amplifier 6 in the first embodiment. Referring now to FIG. 2, the circuit blocks in the power amplifier 6 will be described. In FIG. 2, the power amplifier 6 includes a control circuit CU, a plurality of amplifying portions (first to third amplifying portions) Q1a to Q3a, and a plurality of amplifying portions (fourth to sixth amplifying portions) Q1b to Q3b. Here, the amplifying portions Q1a to Q3a form an amplifying circuit LB, and the amplifying portions Q1b to Q3b form an amplifying circuit HB.

The power amplifier 6 is capable of amplifying signals belonging to two frequency bands. That is, the power amplifier 6 is capable of amplifying a signal using the frequency band of 880 MHz to 915 MHz (GSM low band) for a GSM (Global System for Mobile Communication) system using a first frequency, while being capable of amplifying a signal using the frequency band of 1710 MHz to 1785 MHz (GSM high band) for a DCS (Digital Communication System 1800) system using a second frequency.

The control circuit CU that is present in the power amplifier 6 described above is configured to receive control signals inputted thereto, and control each of the amplifying portions Q1a to Q3a and the amplifying portions Q1b to Q3b based on the inputted control signals. The control circuit CU allows a control signal ($V_{control}$ (GSM)) for controlling the amplifying portions Q1a to Q3a and a control signal ($V_{control}$ (DCS)) for controlling the amplifying portions Q1b to Q3b to be individually and separately inputted thereto. When the amplifying portions Q1a to Q3a are used, the control circuit CU performs a control operation based on the control signal $V_{control}$ (GSM). When the amplifying portions Q1b to Q3b are used, the control circuit CU performs a control operation based on the control signal $V_{control}$ (DCS). In this manner, the power amplifier 6 according to the first embodiment controls the amplification of the signals belonging to the two frequency bands. The control circuit CU is formed of, e.g., a MOSFET (Metal Oxide Semiconductor Field Effect Transistor) and the like.

The amplifying portions Q1a to Q3a are configured to receive an input power (input signal) $P_{in}$ (GSM) for the GSM system inputted thereto, and amplify the input power Pin (GSM) to three levels. That is, the input power Pin (GSM) is first amplified in the amplifying portion Q1a, and then the power amplified in the amplifying portion Q1a is amplified in the amplifying portion Q2a. Subsequently, the power amplified in the amplifying portion Q2a is amplified in the final-stage amplifying portion Q3a, and then outputted as an output signal (output power $P_{out}$ (GSM)) from the power amplifier 6. Thus, the amplifying portions Q1a to Q3a are capable of amplifying the power according to the GSM system.

Likewise, the amplifying portions Q1b to Q3b are configured to receive an input power (input signal) $P_{in}$ (DCS) for the DCS system inputted thereto, and amplify the input power $P_{in}$ (DCS) to three levels. That is, the input power $P_{in}$ (DCS) is first amplified in the amplifying portion Q1b, and then further amplified in the amplifying portion Q2b. Subsequently, the power amplified in the amplifying portion Q2b is further amplified in the amplifying portion Q3b, and then outputted as an output signal (output power $P_{out}$ (DCS)) from the power amplifier 6. Thus, the amplifying portions Q1b to Q3b are capable of amplifying the power according to the DCS system.

<Configuration of Amplifying Circuit>

Figure 3:
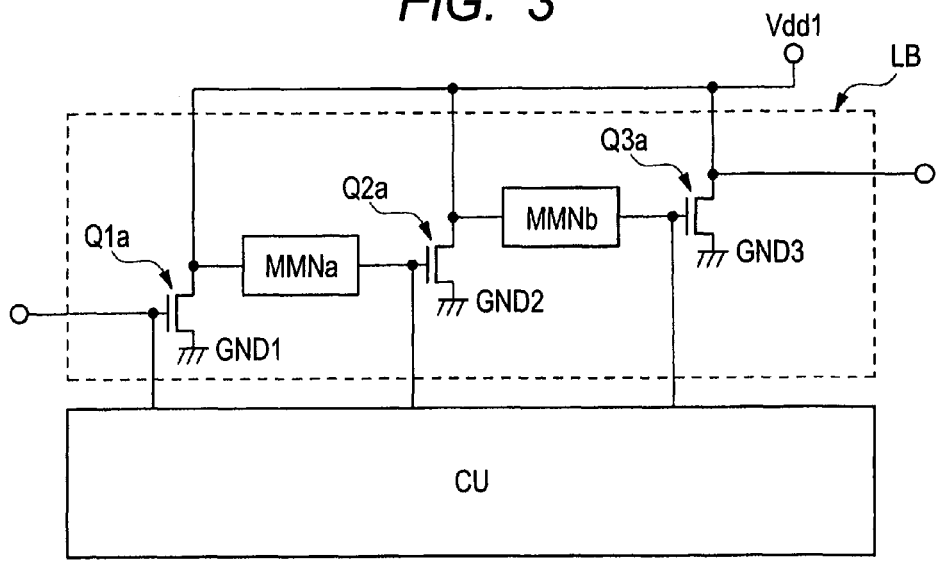
FIG. 3 is a view showing an example of a configuration of an amplifying circuit.

Subsequently, a description will be given to an example of a configuration of the amplifying circuit LB shown in FIG. 2. FIG. 3 is a view showing the example of the configuration of the amplifying circuit LB. Note that the amplifying circuit HB shown in FIG. 2 and not shown in FIG. 3 also has the same configuration as that of the amplifying circuit LB, and therefore a description thereof is omitted.

As shown in FIG. 3, the amplifying circuit LB includes the plurality of amplifying portions Q1a to Q3a formed of LDMOSFETs, and inter-stage matching circuits MMNa and MMNb. The gate electrode of the amplifying portion Q1a is coupled to an input matching circuit not shown, while the drain electrode of the amplifying portion Q1a is coupled to the input of the inter-stage matching circuit MMNa. The output of the inter-stage matching circuit MMNa is coupled to the gate electrode of the amplifying portion Q2a, while the drain electrode of the amplifying portion Q2a is coupled to the input of the inter-Stage matching circuit MMNb. The output of the inter-stage matching circuit MMNb is coupled to the gate electrode of the amplifying portion Q3a, while the drain electrode of the amplifying portion Q3a is coupled to an output matching circuit not shown.

The drain electrodes of the amplifying portions Q1a to Q3a are each coupled to a power source potential $V_{dd1}$, while the source electrodes of the amplifying portions Q1a to Q3a are each coupled to a ground potential. Specifically, the source electrode of the amplifying portion Q1a is coupled to a ground potential GND1, and the source electrode of the amplifying portion Q2a is coupled to a ground potential GND2. Likewise, the source electrode of the amplifying portion Q3a is coupled to a ground potential GND3. On the other hand, the gate electrodes of the amplifying portions Q1a to Q3a are each coupled to the control circuit CU.

In the amplifying circuit LB thus configured, an input signal outputted from the input matching circuit not shown is inputted to the amplifying portion Q1a. Then, in the amplifying portion Q1a, the input signal is amplified based on a bias voltage from the control circuit CU, and an amplification signal is outputted therefrom. Then, the signal amplified in the amplifying portion Q1a is inputted to the amplifying portion Q2a through the inter-stage matching circuit MMNa. In the amplifying portion Q2a, the signal outputted from the amplifying portion Q1a is amplified based on the bias voltage from the control circuit CU, and outputted therefrom. Then, the signal amplified in the amplifying portion Q2a is inputted to the amplifying portion Q3a through the inter-stage matching circuit MMNb. In the amplifying portion Q3a, the signal outputted from the amplifying portion Q2a is amplified based on the bias voltage from the control circuit CU, and outputted therefrom. In this manner, the amplification signal obtained by amplifying the input signal can be outputted from the amplifying circuit LB including the amplifying portions Q1a to Q3a.

Next, a description will be given to a device configuration of the power amplifier 5 described above. The power amplifier 6 is formed in, e.g., one semiconductor chip. In the semiconductor chip (or in a surface layer portion thereof), semiconductor amplifying elements (e.g., LDMOSFETs) forming the amplifying circuits LB and HB, a semiconductor element (MOSFET) forming the control circuit CU, passive elements (passive components) forming the matching circuits (inter-stage matching circuits) MMNa and MMNb, and the like are formed. Thus, in the semiconductor chip, the semiconductor elements forming the power amplifier 6 are formed. The semiconductor chip is obtained by, e.g., forming semiconductor integrated circuits in a semiconductor substrate (semiconductor wafer) comprised of single-crystal silicon or the like, performing grinding on the back surface of the semiconductor substrate as necessary, and then dividing the semiconductor substrate into individual semiconductor chips. A description will be given below to a device configuration of each of the LDMOSFETs as the semiconductor amplifying elements (power transistors) forming the amplifying circuits LB and HB.

<Device Configuration of LDMOSFET>

Figure 4:
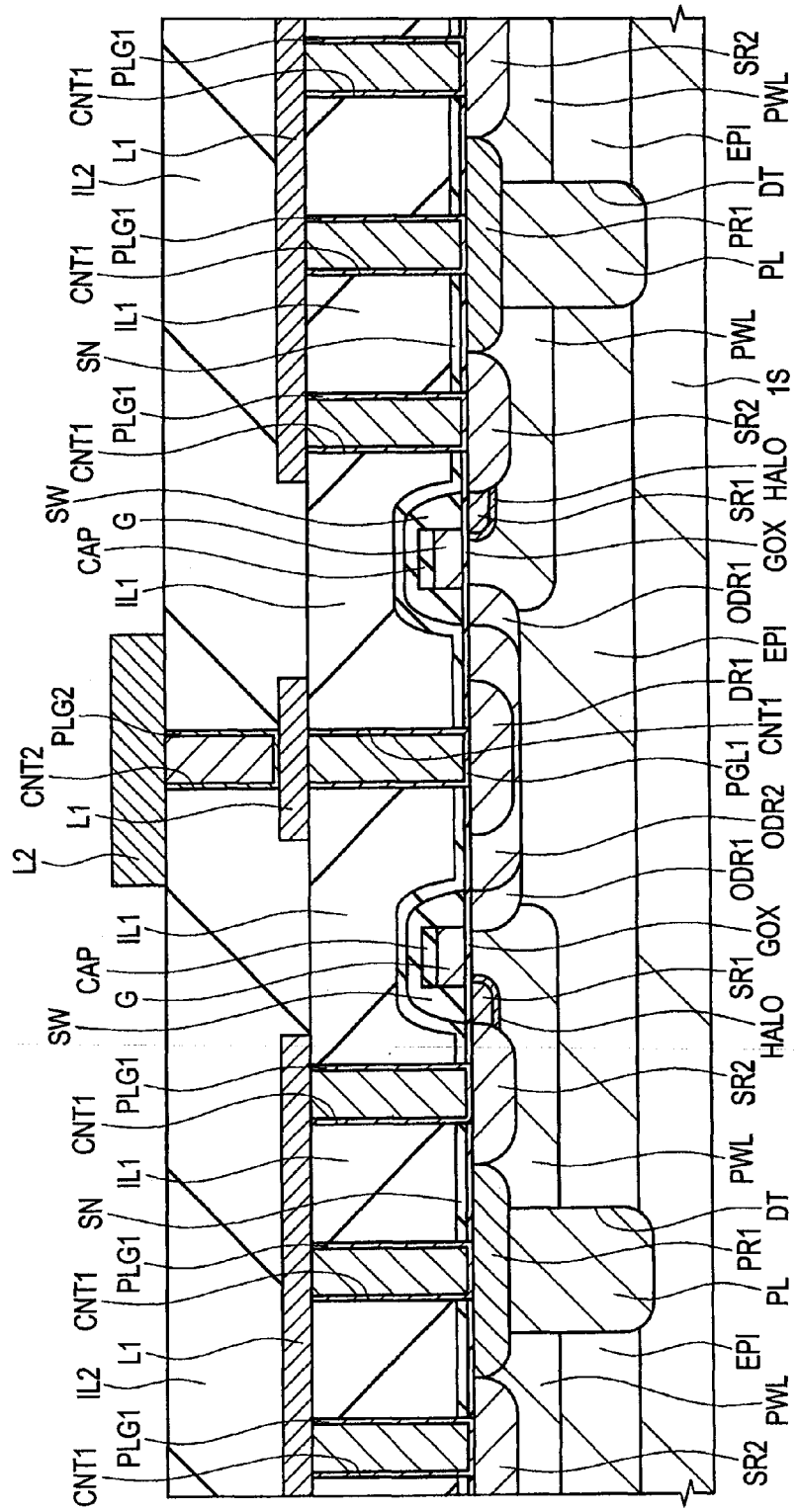
FIG. 4 is a cross-sectional view showing a cross-sectional structure of each of LDMOSFETs.

FIG. 4 is a cross-sectional view showing a cross-sectional structure of each of the LDMOSFETs. In FIG. 4, over a semiconductor substrate 1S comprised of a $p^+$-type silicon single crystal, an epitaxial layer EPI comprised of a $p^-$-type semiconductor layer is formed. In the semiconductor substrate 1S, trenches DT are formed. In each of the trenches DT, e.g., a p-type polysilicon film is buried to form p-type punch-through layers PL. Also, in a surface of the semiconductor substrate 1S, p-type wells PWL are formed.

Over the surface of the semiconductor substrate 1S, a gate insulating film GOX is formed and, over the gate insulating film GOX, gate electrodes G and cap insulating films CAP are formed. The gate insulating film GOX is formed of, e.g., a thin silicon oxide film or the like. Each of the gate electrodes G is formed of a polysilicon film. In alignment with the gate electrodes G, $n^-$-type offset drain regions ODR1 and $n^-$-type source regions SR1 are formed. P-type hallow regions HALO are formed to be adjacent to the $n^-$-type source regions SR1.

Over the both side walls of the gate electrodes G, sidewalls SW are formed. In alignment with the sidewalls SW, an n-type offset drain region ODR2 and an $n^+$-type drain region DR1 are formed. Likewise, in alignment with the sidewalls SW, $n^+$-type source regions SR2 are formed outside the $n^-$-type source regions SR1. Outside the $n^+$-type source regions SR2, $p^+$-type semiconductor regions PR1 are formed.

Over each of the LDMOSFETs thus configured, an interlayer insulating film IL1 comprised of a laminate film of a silicon nitride film SN and a silicon oxide film is formed, and contact holes CNT1 extending through the interlayer insulating film IL1 are formed. In the contact holes CNT1, plugs PLG1 each comprised of, e.g., a barrier film and a tungsten film are buried.

Over the interlayer insulating film IL1 in which the plugs PLG1 are formed, a first-layer wiring line L1 comprised of, e.g., an aluminum film is formed, and an interlayer insulating film IL2 comprised of a silicon oxide film is formed so as to cover the first-layer wiring line L1. In the interlayer insulating film IL2, a connection hole CNT2 is formed to extend therethrough and reach the first-layer wiring line L1. In the connection hole CNT2, a plug PLG2 is buried. Over the interlayer insulating film IL2 in which the plug PLG2 is formed, a second-layer wiring line L2 is formed. In layers upper than the second-layer wiring line L2, another wiring layer and another interlayer insulating film are formed as necessary, but they are omitted in FIG. 4. Note that a plurality of the LDMOSFETs shown in FIG. 4 are coupled in parallel to form, e.g., the amplifying portions Q1a, Q2a, and Q3a shown in FIG. 3.

A first advantage of the LDMOSFETs thus configured is that, as shown in FIG. 4, the $n^+$-type source regions SR2 are electrically coupled to the semiconductor substrate 1. That is, the $n^+$-type source regions SR2 are electrically coupled to the semiconductor substrate 1S via the plugs PLG1, the first-layer wiring line L1, the $p^+$-type semiconductor regions PR1, and the p-type punchthrough layers PL. Therefore, in the LDMOSFETs, a reference potential (GND potential) can be supplied from the back surface of the semiconductor substrate 1S to the n$^+$-type source regions SR2. This means that there is no need to couple the n$^+$-type source regions SR2 to pads formed over the surface of the semiconductor chip via multilayer wiring and couple a wiring board over which the semiconductor chip is mounted to the pads with wires (gold wires) in order to supply the reference potential to the n$^+$-type source regions SR2. That is, when the reference potential (GND potential) is supplied to the n$^+$-type source regions SR2 using the wires, parasitic inductance due to the wires is produced to reduce a power gain in the power amplifier 6. This is because, since the power gain is inversely proportional to the magnitude of impedance (source impedance) coupled to the n$^+$-type source regions SR2 of the LDMOSFETs, when the parasitic inductance due to the wires is produced, the source impedance increases to reduce the power gain. Accordingly, the LDMOSFETs are configured such that, by electrically coupling the n$^+$-type source regions SR2 to the semiconductor substrate 1S, the reference potential is supplied from the back surface of the semiconductor substrate 1S to the n$^+$-type source regions SR2. This eliminates the need to use the wires that increase the parasitic inductance in order to supply the reference potential to the n$^+$-type source regions SR2. Therefore, with the LDMOSFETs, it is possible to reduce the source impedance and consequently suppress a reduction in power gain. Moreover, in each of the LDMOSFETs, the impurity concentration of a conductivity-type impurity introduced into the semiconductor substrate 1S is set high to achieve a low resistance of several ohm-centimeters (mΩ·cm). This configuration allows a reduction in source resistance so that, from this viewpoint also, the source impedance can be reduced. That is, in the LDMOSFETs, by adopting the configuration in which the n$^+$-type source regions SR2 are electrically coupled to the semiconductor substrate 1S and the configuration in which the impurity concentration of the semiconductor substrate 1S is set high, the source impedance can be reduced to allow an improvement in power gain.

A second advantage of the LDMOSFETs is that, as shown in FIG. 4, the offset regions (n$^-$-type offset drain regions ODR1 and n-type offset drain region ODR2) are provided between channel regions immediately below the gate electrodes G and the n$^+$-type drain regions DR1. This allows an increase in the distance between each of the channel regions and the n$^+$-type drain region DR1, and also optimizes the impurity concentrations in the offset regions to allow an improvement in drain breakdown voltage in each of the LDMOSFETs.

<Problem Newly Found by Present Inventors>

Figure 5:
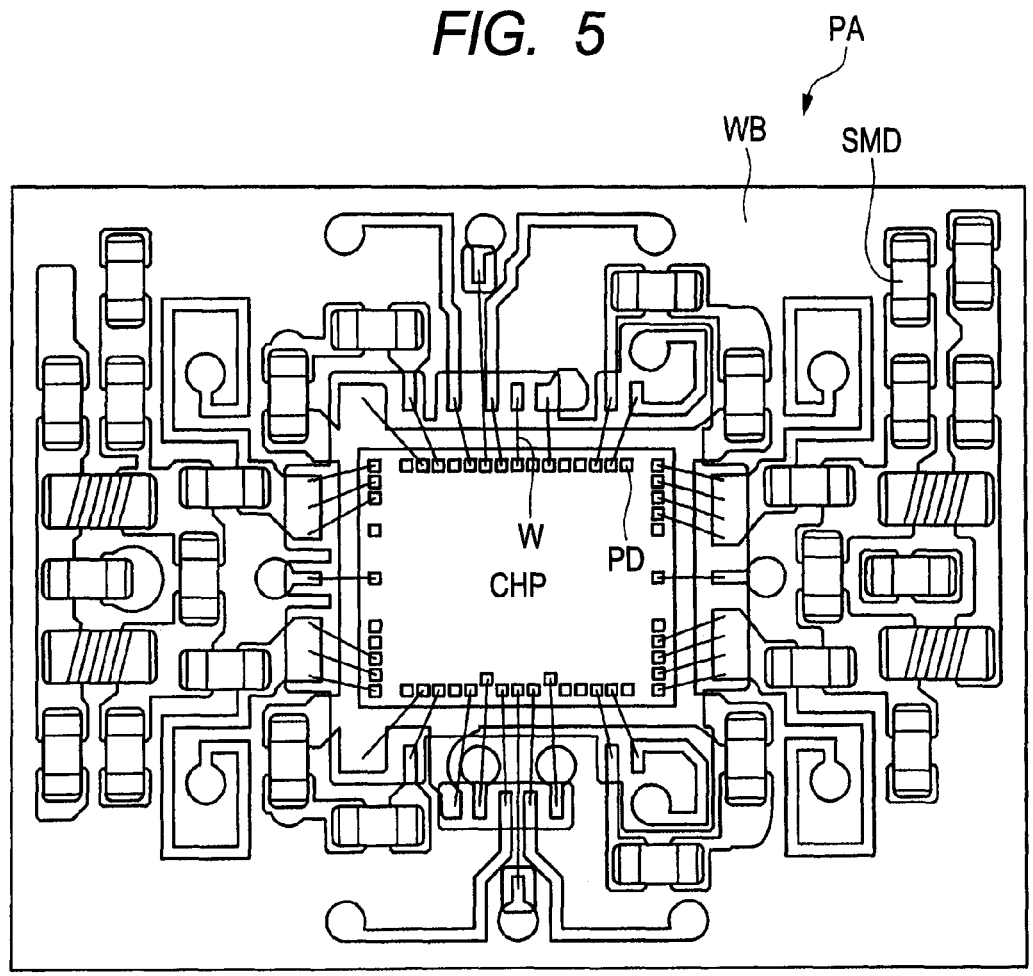
FIG. 5 is a plan view showing an implementation/configuration of a power amplifying module.

The power amplifier 6 described above is implemented/configured as a power amplifying module. FIG. 5 is a plan view showing an implementation/configuration of a power amplifying module PA. As shown in FIG. 5, in the power amplifying module PA, a semiconductor chip CHP and passive components (chip components) SMD are mounted over a wiring board WB having a rectangular shape. The semiconducor chip CHP and the passive components SMD are electrically coupled by a wiring pattern formed over the wiring board WB. Specifically, pads PD formed over a surface of the semiconductor chip CHP and the wiring pattern formed over the wiring board WB are coupled with wires W comprised of, e.g., gold wires or the like. Since the passive components SMD are also coupled to the wiring pattern formed over the wiring board WB, the semiconductor chip CHP and the passive components SMD are consequently electrically coupled via the wires W and the wiring pattern. Examples of the passive components SMD that can be named include a resistive element, an inductive element, a capacitive element (capacitor), and the like.

The semiconductor chip CHP is formed with the LDMOSFETs forming the power amplifier 6. The source regions of the LDMOSFETs are coupled to the back surface of the semiconductor chip CHP. At this time, over the wiring board WB, a ground pattern (GND pattern) for supplying the reference potential (GND potential) is formed and, over the ground pattern, the semiconductor chip CHP is mounted. From this, it can be seen that the reference potential applied to the ground pattern of the wiring board WB is supplied to the source regions of the LDMOSFETs via the back surface of the semiconductor chip CHP coupled to the ground pattern. On the other hand, the drain regions of the LDMOSFETs are coupled to the multilayer wiring formed in the semiconductor chip CHP, and eventually electrically coupled to the pads PD formed over the surface (upper surface) of the semiconductor chip CHP. It follows therefore that the drain regions of the LDMOSFETs are coupled to the pads PD via the multilayer wiring, and the pads PD are further coupled to the passive components SMD mounted over the wiring board WB via the wires W and the wiring pattern. Here, since the passive components SMD mounted over the wiring board WB form the output matching circuit and a lowpass filter, the drain regions of the LDMOSFETs are consequently electrically coupled to the output matching circuit and the lowpass filter. That is, the amplification signal (transmission signal) resulting from the amplification in the LDMOSFETs is inputted from the drain regions to the output matching circuit via the multilayer wiring, the pads PD, and the wires W. Thereafter, the transmission signal outputted from the output matching circuit passes through the lowpass filter, and then outputted from the power amplifying module PA. The output matching circuit has the function of allowing efficient transmission of the transmission signal by suppressing the reflection of the transmission signal. The lowpass filter has the function of removing high-order harmonics (noise components) included in the transmission signal.

Thus, the power amplifying module PA is configured. However, in an actual situation, to protect the semiconductor chip CHP and the passive components SMD mounted over the wiring board WB, a sealing body comprised of a resin is formed so as to cover the semiconductor chip CHP and the passive components SMD. The power amplifying module PA handles high power, and therefore serves as a large generation source of an electromagnetic wave. Accordingly, to inhibit the electromagnetic wave generated in the power amplifying module PA from affecting another semiconductor device mounted in a mobile telephone, it has been practiced to form a shield film over a surface of the sealing body forming the power amplifying module PA. That is, by forming the shield film electrically coupled to the reference potential (GND potential) over the surface of the sealing body forming the power amplifying module PA, it is possible to inhibit the electromagnetic wave generated in the power amplifying module PA from leaking to the outside, and also inhibit an electromagnetic wave existing outside from entering the power amplifying module.

However, as a result of conducting study, the present inventors have found that, in a related art power amplifying module, a shield film formed over a surface of a sealing body peels from the surface of the sealing body, resulting in a problem that a part of the shield film bulges (rises) from the surface of the sealing body. When such peeling (bulging) of the shield film has occurred in the power amplifying module, it causes an outer appearance failure in an electric characteristic inspection step performed on the power amplifying module or in a mounting step performed by a purchaser.

To prevent this, the present inventors have first studied the mechanism of the occurrence of the peeling (bulging) of the shield film in the related art power amplifying module. The following is a description of the mechanism.

Figure 6:
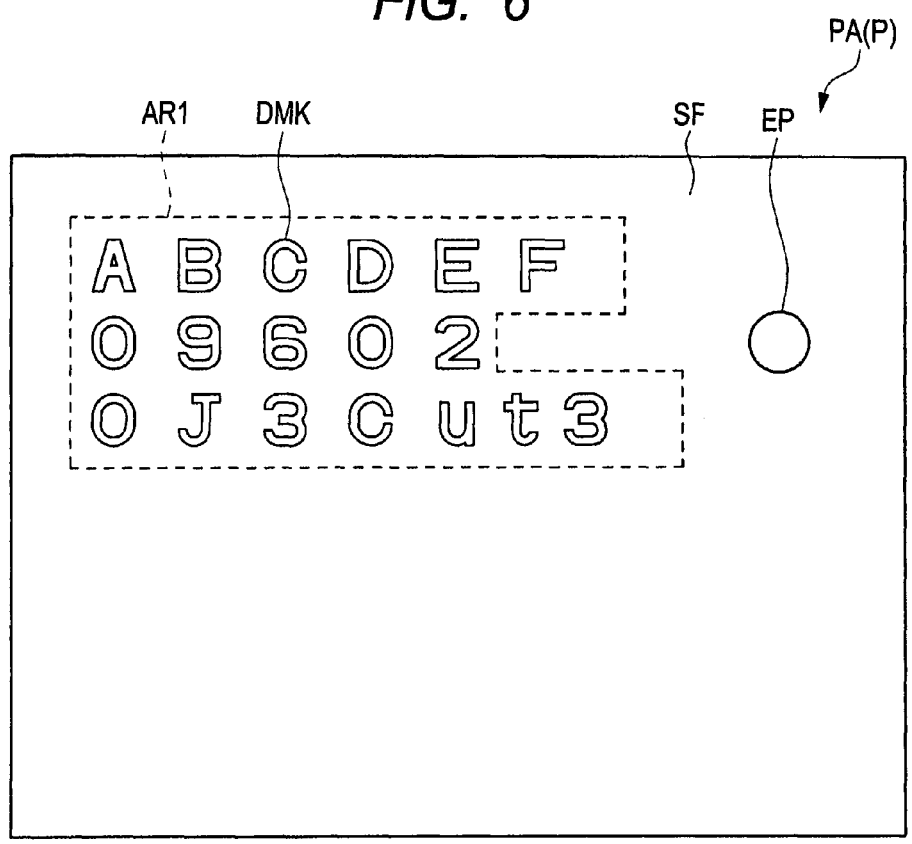
FIG. 6 is a top view showing an implementation/configuration of a related art power amplifying module.

FIG. 6 is a top view showing an implementation/configuration of a related art power amplifying module PA(P). As shown in FIG. 6, the related art power amplifying module PA(P) has an outer profile portion comprised of a sealing body having a rectangular shape, and a shield film SF is formed so as to cover a surface of the sealing body. The shield film SF is formed of a multilayer film of, e.g., a copper film and a nickel film. Also, in the surface of the sealing body, product identification marks DMK for identification of the individual power, amplifying module PA(P) are formed. For example, the product identification marks DMK are formed of a combination of a sequence of letters, such as alphabets, and a numerical sequence of numbers to provide marks specific to the individual power amplifying module PA(P). Thus, based on the product identification marks DMK formed in the power amplifying module PA(P), the individual power amplifying module PA(P) can be discriminated from another power amplifying module PA(P).

The product identification marks DMK are formed in a product-identification-mark formation region AR1. However, it has been found that the peeling of the shield film SF does not occur inside the product-identification-mark formation region AR1, but occurs outside the product-identification-mark formation region AR1. In other words, it has been found that, as shown in FIG. 6, a peeling portion EP is likely to be formed in a region outside the product-identification-mark formation region AR1. As a result of intensively examining the cause thereof, the present inventors have come to the assumption that the peeling is caused by a mechanism as shown below.

First, in the manufacturing steps of the power amplifying module PA(P), components such as a semiconductor chip are mounted over a wiring board, and then pads formed over a surface of the semiconductor chip and a wiring pattern formed over the wiring board are coupled with wires. Then, a sealing body comprised of a resin is formed so as to cover the surface of the wiring board over which the semiconductor chip and the passive components are mounted. Next, by, e.g., irradiating a surface of the sealing body with laser light, the product identification marks DMK are formed in the product-identification-mark formation region AR1 as shown in FIG. 6. The step is performed by evaporating the resin forming the surface of the sealing body irradiated with the laser light and thereby forming the surface of the sealing body into an indented shape. That is, the product identification marks DMK are comprised of the indented shape into which the surface of the sealing body has been formed. Thereafter, the entire surface of the sealing body is subjected to a roughening etching treatment, and then a shield film SF is formed over the surface of the sealing body. Subsequently, the power amplifying module PA(P) is subjected to a heat treatment (bake treatment). The foregoing is a brief description of the formation of the power amplifying module PA(P).

Here, when attention is focused on the step of forming the shield film SF, the surface of the sealing body is first subjected to the roughening etching treatment. The roughening etching treatment is performed to form the surface of the sealing body into the indented shape and improve the adhesion between the shield film SF subsequently formed over the surface of the sealing body and the sealing body. That is, the roughening etching treatment is performed to form the surface of the sealing body into the indented shape and thereby achieve improved adhesion using an anchor effect produced in the interface between the roughened surface of the sealing body and the shield film SF.

Specifically, the roughening etching treatment is performed by etching the resin forming the sealing body. That is, to improve the thermal conductivity of the sealing body, a filler is added to the resin thereof. In the roughening etching treatment described above, only the resin portion of the resin containing the filler is etched. As a result, the resin existing between the filler particles is removed so that the surface of the sealing body is formed in the indented shape after subjected to the roughening etching treatment.

The filler is not evenly distributed in the resin, and the distribution thereof is biased to a degree. Accordingly, in a region where the filler exists in a large quantity, the indented shape is likely to be formed since the resin between the filler particles has been removed. However, in a region where the filler exists in a small quantity, substantially only the resin exists and is uniformly etched so that the indented shape is less likely to be formed, and consequently nearly planar regions exist. That is, even when the roughening etching treatment is performed, due to the uneven distribution of the filler contained in the region, the indented shape is not formed so that the nearly planar regions exist. As a result, at the surface in a nearly planar state, the anchor effect is less likely to be produced, and therefore it is presumed that an improvement in the adhesion between the surface of the sealing body and the shield film SF cannot be achieved.

After the roughening etching treatment is performed, the shield film SF is further formed over the surface of the sealing body. The shield film SF is formed by, e.g., an electroless plating method. Specifically, in the electroless plating method, the sealing body is dipped in a plating solution and, by a chemical relation at the surface of the sealing body, the shield film SF is formed over the surface of the sealing body. Here, when the sealing body is dipped in the plating solution, air may be contained therein, and air bubbles may conceivably be attached to the surface of the sealing body. It is considered that air bubbles are particularly more likely to be attached to the nearly planar regions of the surface of the sealing body than to the region thereof having the indented shape. When the shield film SF is formed in a state where the air bubbles are thus attached to the surface of the sealing body, the air bubbles remain between the surface of the sealing body and the shield film SF. Then, the air bubbles are heated by the heat treatment (bake treatment) performed after the formation of the shield film SF to expand. As a result, it is presumed that, by the expansion of the air bubbles, the shield film SF peels from the surface of the sealing body so that the peeling portion EP is formed.

The following is the summary of the foregoing description. First, in the resin forming the sealing body, the filler is contained, but the filler contained in the resin is not evenly distributed and the distribution thereof is biased to a degree. Even if the roughening etching treatment is performed in this state, the surface of the sealing body is not formed into an evenly indented shape, and the nearly planar regions exist. If the nearly planar regions thus exist in the surface of the sealing body, due to a first factor which is the air bubbles more likely to be attached to the sealing body when the sealing body is dipped in the plating solution and to a second factor which is the anchor effect less likely to be produced, the peeling portion EP is presumably formed between the surface of the sealing body and the shield film SF. It is considered that, in particular, the heat treatment (bake treatment) performed after the formation of the shield film SF makes apparent the formation of the peeling portion EP between the surface of the sealing body and the shield film SF. It is conceived that the mechanism is also confirmed by the fact that the peeling portion EP is not formed in the product-identification-mark formation region AR1 where the product identification marks DMK comprised of the indented shape are formed.

Accordingly, in the first embodiment, based on the findings that, if the nearly planar regions exist in the surface of the sealing body, due to the first factor which is the air bubbles more likely to be attached to the sealing body when the sealing body is dipped in the plating solution and to the second factor which is the anchor effect less likely to be produced, the peeling portion EP is likely to be formed between the surface of the sealing body and the shield film SF, an inventive approach is provided which is a reduction in the nearly planar regions of the surface of the sealing body. A description will be given below to the technical idea of the first embodiment based on which the inventive approach is provided.

<Characteristic Feature of First Embodiment>

Figure 7:
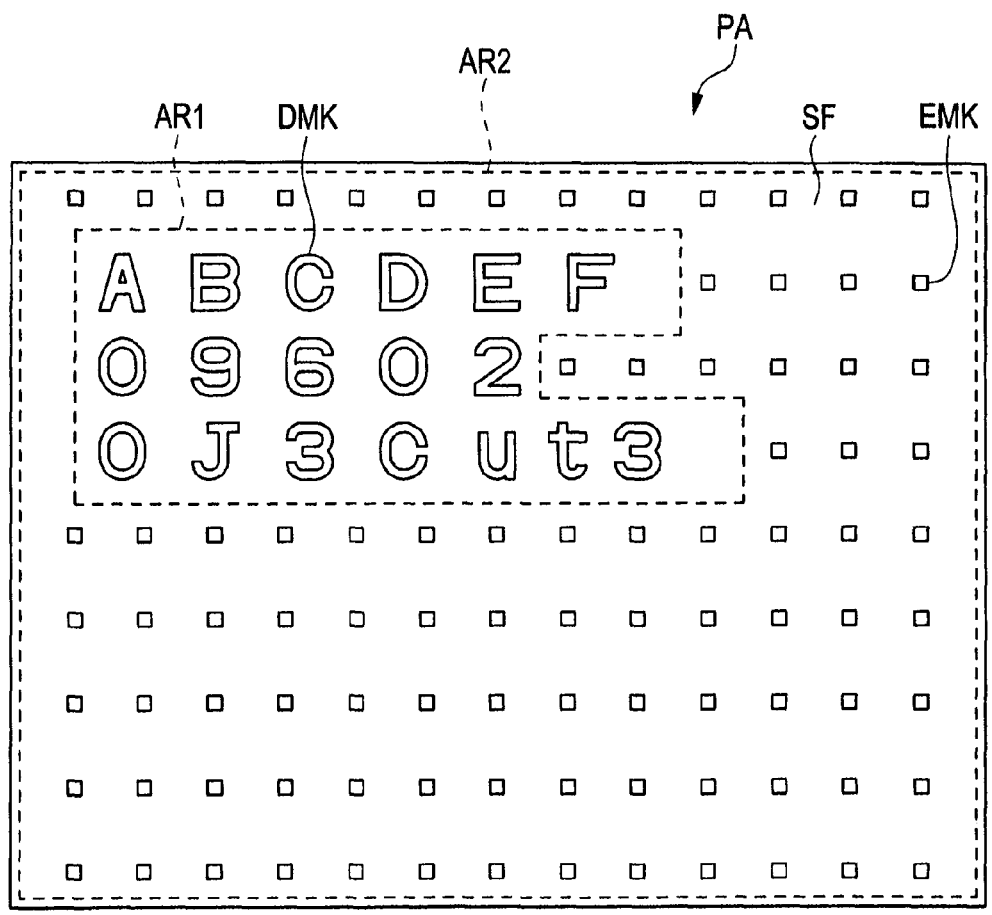
FIG. 7 is a top view showing an outer appearance configuration of the power amplifying module in the first embodiment.

FIG. 7 is a top view showing an outer appearance configuration of the power amplifying module PA in the first embodiment. As shown in FIG. 7, the power amplifying module PA in the first embodiment has the outer profile portion comprised of the sealing body having the rectangular shape, and the shield film SF is formed so as to cover the surface of the sealing body. The shield film SF is formed of the laminate film of, e.g., a copper film and a nickel film. Since the copper film is easily oxidized, if the shied film SF is formed only of the copper film, a surface of the shield film SF is undesirably oxidized. Therefore, to suppress the oxidization of the surface of the shield film SF, the nickel film is formed over the copper film. Also, in the surface of the sealing body, the product identification marks DMK for identification of the individual power amplifying module PA are formed. For example, the product identification marks DMK are formed of a combination of a sequence of letters, such as alphabets, and a numerical sequence of numbers to provide marks specific to the individual power amplifying module PA. Thus, based on the product identification marks DMK formed in the power amplifying module PA, the individual power amplifying module PA can be discriminated from another power amplifying module PA. The product identification marks DMK are formed in the product-identification-mark formation region AR1 of the surface region of the sealing body.

The characteristic feature of the first embodiment is that a peeling-prevention-mark formation region AR2 is provided so as to surround the product-identification-mark formation region AR1, and a plurality of peeling prevention marks EMK are formed in the peeling-prevention-mark formation region AR2. That is, the first embodiment is characterized in that the region of the surface region of the sealing body different from the product-identification-mark formation region AR1 is defined as the peeling-prevention-mark formation region AR2, and the plurality of peeling prevention marks EMK are formed in the peeling-prevention-mark formation region AR2.

For example, in the related art power amplifying module PA(P) shown in FIG. 6, in the region outside the product-identification-mark formation region AR1, no mark is formed, and only the surface of the sealing body exists. In this case, if a roughening etching treatment is performed to prevent the peeling of the shield film SF from the surface of the sealing body, the surface of the sealing body is not formed into an evenly indented shape so that the nearly planar regions (referred to as planar regions) undesirably exist in the region outside the product-identification-mark formation region AR1. It is considered that, if the planar regions thus exist in the surface of the sealing body, due to the first factor which is the air bubbles more likely to be attached to the sealing body when the sealing body is dipped in the plating solution and to the second factor which is the anchor effect less likely to be produced, the peeling portion EP is formed between the surface of the sealing body and the shield film SF.

By contrast, in the power amplifying module PA in the first embodiment shown in FIG. 7, the peeling-prevention-mark formation region AR2 is provided so as to surround the product-identification-mark formation region AR1 and, in the peeling-prevention-mark formation region AR2, the plurality of peeling prevention marks EMK are formed. Therefore, whether or not the roughening etching treatment is performed, the indented shape is formed not only in the product-identification-mark formation region AR1, but also in the peeling-prevention-mark formation region AR2. This can reduce the existing planar regions, and thereby suppress the first factor which is the air bubbles more likely to be attached to the sealing body when the sealing body is dipped in the plating solution and the second factor which is the anchor effect less likely to be produced. As a result, it is possible to inhibit the peeling portion (bulged portion) from being formed between the surface of the sealing body and the shield film SF. Therefore, according to the first embodiment, it is possible to inhibit an outer appearance failure due to the peeling (bulging) of the shield film SF.

Thus, the technical idea of the first embodiment is to form the plurality of peeling prevention marks EMK in the peeling-prevention-mark formation region AR2 formed to surround the product-identification-mark formation region AR1 so as to minimize the planar regions therein, and thereby form the indented shape. This allows, e.g., a reduction in the planar regions formed in the peeling-prevention-mark formation region AR2. However, since the plurality of peeling prevention marks EMK are provided at regular spacings, the planar regions cannot completely be eliminated but, at least by providing the plurality of peeling prevention marks EMK at given spacings, the number of the planar regions can be reduced, and the area of each of the planar regions can also be reduced. This firstly means that, since the area of each of the planar regions can be reduced, even when the sealing body is dipped in the plating solution, the sizes of the air bubbles attached to the planar regions can be reduced. The fact that the sizes of the air bubbles attached to the planar regions can be reduced means that, even when the air bubbles expand through the heat treatment (bake treatment) after the formation of the shield film SF over the surface of the sealing body, due to the small sizes of the air bubbles, the volumes of the expanded air bubbles can also be reduced. Therefore, it is possible to inhibit the shield film SF from peeling from the surface of the sealing body. That is, as the sizes of the air bubbles are larger, a larger force is required to peel the shield film SF from the surface of the sealing body. However, since the first embodiment can reduce the sizes of the air bubbles, it is possible to minimize the force required to peel the shied film SF from the surface of the sealing body, and thereby effectively inhibit the peeling portion (bulged portion) from being formed between the surface of the sealing body and the shield film SF.

The fact that the areas of the individual planar regions can be reduced secondly means that regions where the anchor effect decreases can be reduced. Accordingly, the adhesion between the surface of the sealing body and the shield film SF can be improved. Consequently, from this viewpoint also, it will be understood that the formation of the peeling portion (bulged portion) between the surface of the sealing body and the shield film SF can be effectively inhibited.

Thus, the characteristic feature of the first embodiment is that the plurality of peeling prevention marks EMK are formed in the peeling-prevention-mark formation region AR2. However, as described above, the spacings between the plurality of peeling prevention marks EMK determine the sizes (areas) of the planar regions. This shows that, in the first embodiment, the spacings at which the plurality of peeling prevention marks EMK are provided are particularly important, which will be described below. First, the present inventors have focused attention on the fact that, in the product-identification-mark formation region AR1 where the product identification marks DMK comprised of the indented shape are formed, the peeling of the shield film SF has not occurred. The fact shows that, if the spacings between the plurality of peeling prevention marks EMK are set substantially the same as the spacings between the product identification marks DMK, the peeling of the shield film SF can be reliably prevented. Accordingly, in the first embodiment, the spacings between the plurality of peeling prevention marks EMK are set substantially the same as the spacings between the product identification marks DMK. Here, in consideration of the case where the spacings between the sequences of letters and numerals forming the product identification marks DMK are not uniform, it is desirable to set the pitch spacing of the plurality of peeling prevention marks EMK the same as the minimum pitch spacing in an identification pattern forming the product identification marks DMK. This is because, since the number and sizes of the planar regions can be reduced as the pitch spacing of the plurality of peeling prevention marks EMK decreases, it is considered that the peeling of the shield film SF can be effectively inhibited. That is, if the spacings between the plurality of peeling prevention marks EMK are set substantially the same as the spacings between the product identification marks DMK, the peeling of the shield film SF can be reliably prevented. Moreover, in terms of reliably preventing the peeling of the shield film SF, it is desirable to set the pitch spacing of the plurality of peeling prevention marks EMK the same as the minimum pitch spacing in the identification pattern forming the product identification marks DMK. Specifically, the pitch spacing of the peeling prevention marks EMK is, e.g., 0.55 mm.

Subsequently, it can be considered that, by the respective depths of the plurality of peeling prevention marks EMK, the magnitude of the anchor effect is particularly determined. Therefore, the respective depths of the plurality of peeling prevention marks EMK can also be considered to be an important element in terms of preventing the peeling of the shield film SF, which will also be described below. For example, as the peeling prevention marks EMK are shallower, the anchor effect in the peeling prevention marks EMK is smaller. This shows that, in terms of preventing the peeling of the shield film SF by increasing the anchor effect, it is desirable to maximize the depths of the peeling prevention marks EMK. However, if the peeling prevention marks EMK are excessively deepened, the bottoms of the peeling prevention marks EMK undesirably reach the internal semiconductor chip, wires, and passive components covered with the sealing body so that the significance of covering these components with the sealing body is lost. Therefore, the depths of the peeling prevention marks EMK cannot be endlessly increased. What is important here is to obtain the anchor effect sufficient to prevent the peeling of the shield film SF. If attention is focused again here on the fact that the peeling of the shield film SF has not occurred in the product-identification-mark formation region AR1 where the product identification marks DMK comprised of the indented shape are formed, it follows that the peeling of the shield film SF can be prevented if the depths of the peeling prevention marks EMK are set substantially the same as the depths of the product identification marks DMK. Accordingly, in the first embodiment, the depths of the peeling prevention marks EMK are set substantially the same as the depths of the product identification marks DMK. Specifically, the depths of the peeling prevention marks EMK are set to, e.g., about 50 µm, which is substantially the same as the depths of the production identification marks DMK. Thus, according to the first embodiment, the peeling of the shield film SF can be reliably prevented.

The size of the indented shape (surface roughness) formed by the roughening etching treatment is about several micrometers. As a reason why the roughening etching treatment cannot sufficiently inhibit the peeling of the shield film SF, the uneven distribution of the filler contained in the resin forming the sealing body has been shown, but the fact that the size of the indented shape is only about several micrometers can also be considered to be another reason. That is, it is the fact that, with only the roughening etching treatment, the peeling of the shield film SF cannot sufficiently be inhibited. Therefore, an approach of setting the depths of the peeling prevention marks EMK to several micrometers which is substantially the same as the depth achieved by the roughening etching treatment cannot be used in terms of reliably preventing the peeling of the shield film SF. On the other hand, it can be said that an approach of focusing attention on the fact that the peeling of the shield film SF has not occurred in the product-identification-mark formation region AR1 where the product identification marks DMK comprised of the indented shape are formed, and setting the depths of the peeling prevention marks EMK to about 50 µm, which is substantially the same as the depths of the production identification marks DMK, is appropriate in terms of reliably preventing the peeling of the shield film SF.

Next, a description will be given to the two-dimensional sizes of the peeling prevention marks EMK. In this case also, attention is focused on fact that the peeling of the shield film SF has not occurred in the product-identification-mark formation region AR1 where the product identification marks DMK comprised of the indented shape are formed. For example, as the product identification marks DMK, desired sequences of letters and numbers are formed in the surface of the sealing body by irradiating the surface of the sealing body with laser light to increase the temperature of the region irradiated with the laser light, evaporate the resin containing the filler, and form the indented shape, and scanning the region irradiated with the laser light. That is, if the indented shape formed by one shot of laser irradiation is defined as a spot, by forming a plurality of the spots, the letters and numbers forming the product identification marks DMK are formed. Accordingly, in the first embodiment, the two-dimensional sizes of the peeling prevention marks EMK are set substantially the same as the two-dimensional sizes of the spots described above. Specifically, the two-dimensional sizes of the peeling prevention marks EMK are about 0.1 mm square.

The foregoing description has been given from the performance viewpoint of effectively preventing the peeling of the shield film SF. However, in terms of actually manufacturing the power amplifying module PA, it is necessary to also consider the simplification of the manufacturing steps and an improvement in throughput. Therefore, a description will be given below to a configuration of the peeling prevention marks EMK from the viewpoint of focusing attention on the simplification of the manufacturing step and an improvement in throughput.

First, the product identification marks DMK are formed by, e.g., laser marking. Accordingly, if the peeling prevention marks EMK are also formed in the step of performing laser marking to form the product identification marks DMK, there is no need to add an extra step of forming the peeling prevention marks EMK. That is, by also forming the peeling prevention marks EMK in the step of performing laser marking to form the product identification marks DMK, the peeling prevention marks EMK can be formed in the sealing body without complicating the manufacturing steps of the power amplifying module PA. This is also useful from the performance viewpoint of effectively preventing the peeling of the shield film SF. This is because, since the pitch spacing and depths of the peeling prevention marks EMK are equal to those of the product identification marks DMK and the two-dimensional sizes of the peeling prevention marks EMK are the same as those of the spots as described above, by forming the product identification marks DMK and the peeling prevention marks EMK in the same step, it is possible to easily realize the characteristic feature of the first embodiment.

Additionally, in the first embodiment, in terms of improving the throughput, the two-dimensional size of each of the peeling prevention marks EMK is set substantially the same as the size of the spot that can be formed by one shot of laser irradiation. For example, when the two-dimensional size of the peeling prevention mark EMK is set larger than the spot size, to form one peeling prevention mark EMK, a plurality of shots of laser irradiation are needed to reduce the throughput. However, in the first embodiment, the two-dimensional size of the peeling prevention mark EMK is set substantially the same as the size of the spot. This allows one peeling prevention mark EMK to be formed by one shot of laser irradiation. Therefore, in the first embodiment, it is possible to improve the throughput in forming the peeling prevention marks EMK.

The first embodiment is also characterized in that the plurality of peeling prevention marks EMK are formed from identical patterns. Accordingly, the effect of allowing the plurality of peeling prevention marks EMK to be efficiently formed can be obtained. Thus, according to the first embodiment, the power amplifying module PA having an external appearance configuration as shown in, e.g., FIG. 7 is provided. Specifically, in the power amplifying module PA in the first embodiment, the product identification marks DMK are formed of the identification pattern including the plurality of sequences of letters and numbers, and each of the plurality of peeling prevention marks EMK is formed of a dot pattern in the form of a point. The number of the plurality of identical patterns (dot patterns) forming the peeling prevention marks EMK is larger than the number of the plurality of sequences of letters and numbers forming the identification pattern.

Figure 8:
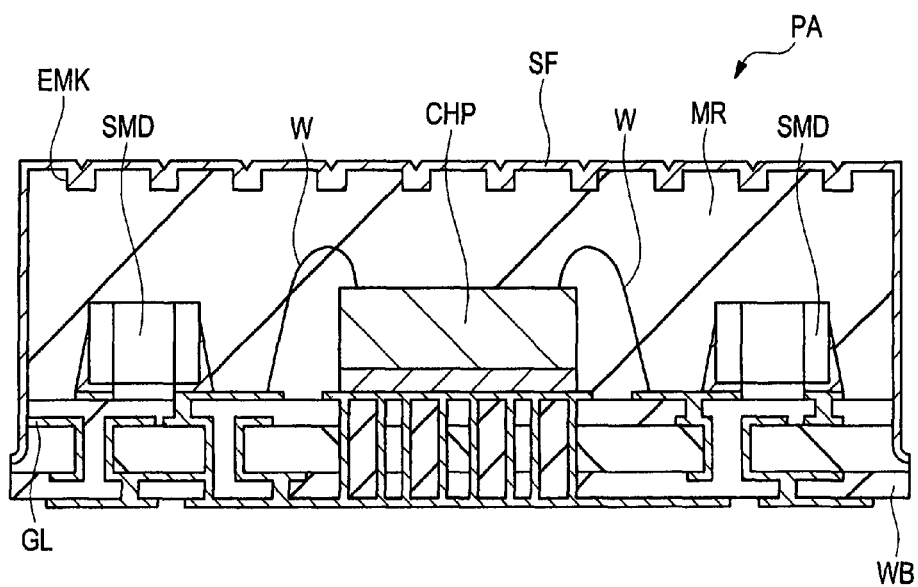
FIG. 8 is a cross-sectional view showing a cross-sectional structure of the power amplifying module in the first embodiment.

Next, a description will be given to a configuration of the power amplifying module PA in the first embodiment with reference to a cross-sectional view. FIG. 8 is a cross-sectional view showing a cross-sectional structure of the power amplifying module PA in the first embodiment. As shown in FIG. 8, the power amplifying module PA in the first embodiment has the wiring board WB having the multilayer wiring layer in the inside thereof and, over the wiring board WB, the semiconductor chip CHP and the passive components SMD are mounted. The semiconductor chip CHP is electrically coupled to, e.g., the wiring pattern formed over the wiring board WB with the wires W.

Over the wiring board WB, a sealing body MR comprised of, e.g., an epoxy resin containing a filler comprised of silica or the like added thereto is formed so as to cover the semiconductor chip CHP, the wires W, and the passive components SMD. In the surface of the sealing body MR, the plurality of peeling prevention marks EMK each comprised of the recessed portion are formed. Over the surface of the sealing body MR in which the peeling prevention marks EMK are formed, the shield film SF is formed. The shield film SF is formed of the multilayer film of, e.g., a copper film and a nickel film. The shield film SF extends from over the surface of the sealing body MR to over the side surfaces thereof to be formed also over parts of the side surfaces of the wiring board WB. Over the side surfaces of the wiring board WB, the shield film SF is electrically coupled to a reference wiring line (wiring line for supplying the reference potential (GND potential)) GL formed in the wiring board WB. From this, it can be seen that the potential of the shield film SF is the reference potential. Therefore, it can be seen that the semiconductor chip CHP formed with semiconductor elements such as, e.g., LDMOSFETs is surrounded by the shield film SF fixed to the reference potential. As a result, an electromagnetic wave generated from the semiconductor chip CHP is blocked by the shield film SF fixed to the reference potential. Consequently, it is possible to reduce the leakage of the electromagnetic wave from the power amplifying module PA, and inhibit the electromagnetic wave generated in the power amplifying module PA from adversely affecting another semiconductor device. Likewise, the shield film SF fixed to the reference potential can also effectively inhibit an electromagnetic wave existing outside from reaching the inside of the power amplifying module PA. Therefore, it is also possible to reduce an adverse effect exerted by the electromagnetic wave generated outside on the power amplifying module PA.

In the power amplifying module PA used in the first embodiment, the peeling prevention marks EMK comprised of the indented shape are formed in the surface of the sealing body MR. Therefore, it is possible to inhibit the shield film SF from peeling from the sealing body MR.

<Modifications>

Figure 9:
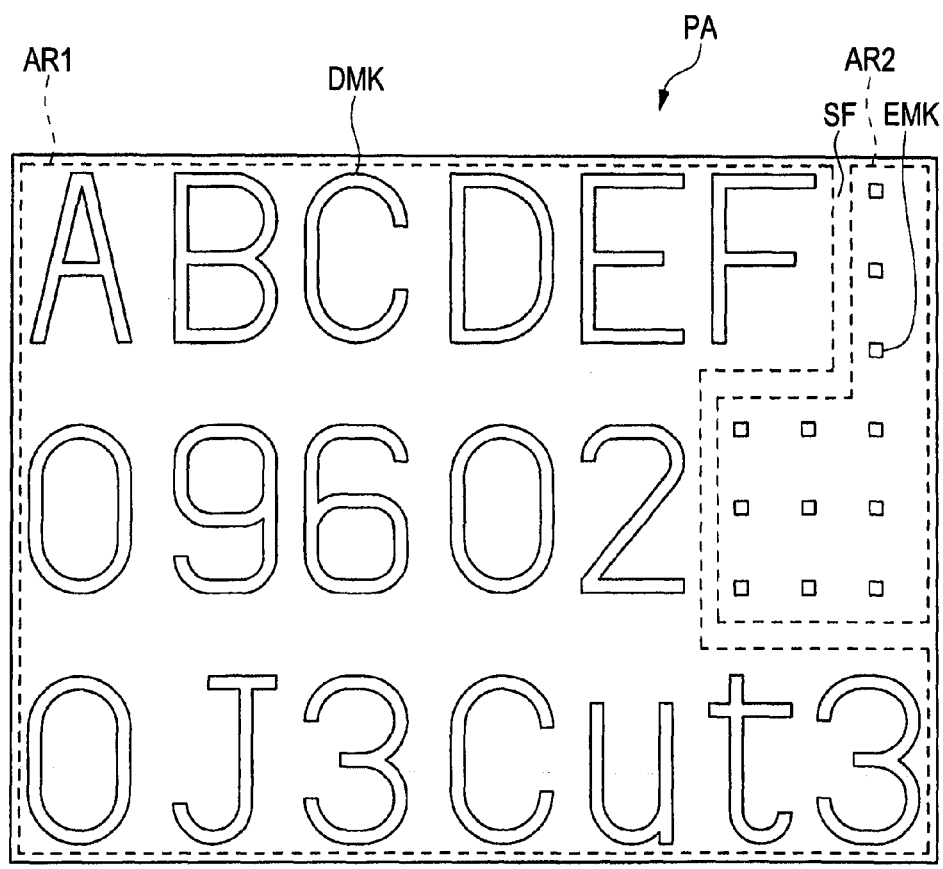
FIG. 9 is a plan view showing an outer appearance configuration of a power amplifying module in a first modification.

Subsequently, a description will be given to modifications of the power amplifying module PA in the first embodiment. FIG. 9 is a plan view showing an outer appearance configuration of the power amplifying module PA in the first modification. As shown in FIG. 9, the power amplifying module PA in the first modification has a sealing body having a rectangular shape, and the shield film SF is formed over a surface of the sealing body. Also, in the surface of the sealing body, the product-identification-mark formation region AR1 and the peeling-prevention-mark formation region AR2 are present. In the product-identification-mark formation region AR1, the product identification marks DMK are formed. In the peeling-prevention-mark formation region AR2, the peeling prevention marks EMK are formed.

The characteristic feature of the first modification is that the area of the product-identification-mark formation region AR1 is larger than the area of the peeling-prevention-mark formation region AR2. For example, in the power amplifying module PA in the first embodiment described above, the area of the product-identification-mark formation region AR1 is smaller than the area of the peeling-prevention-mark formation region AR2, as shown in FIG. 7. In this case, since the area of the peeling-prevention-mark formation region AR2 is large, the number of the peeling prevention marks EMK formed in the peeling-prevention-mark formation region AR2 is also large. As a result, a time required to form the plurality of peeling prevention marks EMK is elongated.

By contrast, in the power amplifying module PA in the first modification, the area of the product-identification-mark formation region AR1 is larger than the area of the peeling-prevention-mark formation region AR2, as shown in FIG. 9. This allows the area of the peeling-prevention-mark formation region AR2 to be sufficiently reduced. Accordingly, the number of the peeling prevention marks EMK formed in the peeling-prevention-mark formation region AR2 is also reduced, and therefore the time required to form the plurality of peeling prevention marks EMK can be shortened. That is, according to the first modification, the throughput in the manufacturing steps of the power amplifying module PA can be improved. Thus, in the first modification, a configuration is provided in which the product identification marks DMK are formed of an identification pattern including the plurality of sequences of letters and numbers, and the number of the plurality of identical patterns (dot patterns) forming the peeling prevention marks EMK is set smaller than the number of the plurality of sequences of letters and numbers forming the identification pattern.

The configuration of the first modification is otherwise the same as in the first embodiment described above. That is, in the first modification also, the indented shape is formed not only in the product-identification-mark formation region AR1, but also in the peeling-prevention-mark formation region AR2. This can reduce the planar regions existing in the surface of the sealing body, and thereby suppress the first factor which is the air bubbles more likely to be attached to the sealing body when the sealing body is dipped in the plating solution and the second factor which is the anchor effect less likely to be produced. As a result, it is possible to inhibit the peeling portion (bulged portion) from being formed between the surface of the sealing body and the shield film SF. Therefore, according to the first modification also, it is possible to inhibit an outer appearance failure due to the peeling (bulging) of the shield film SF.

Figure 10:
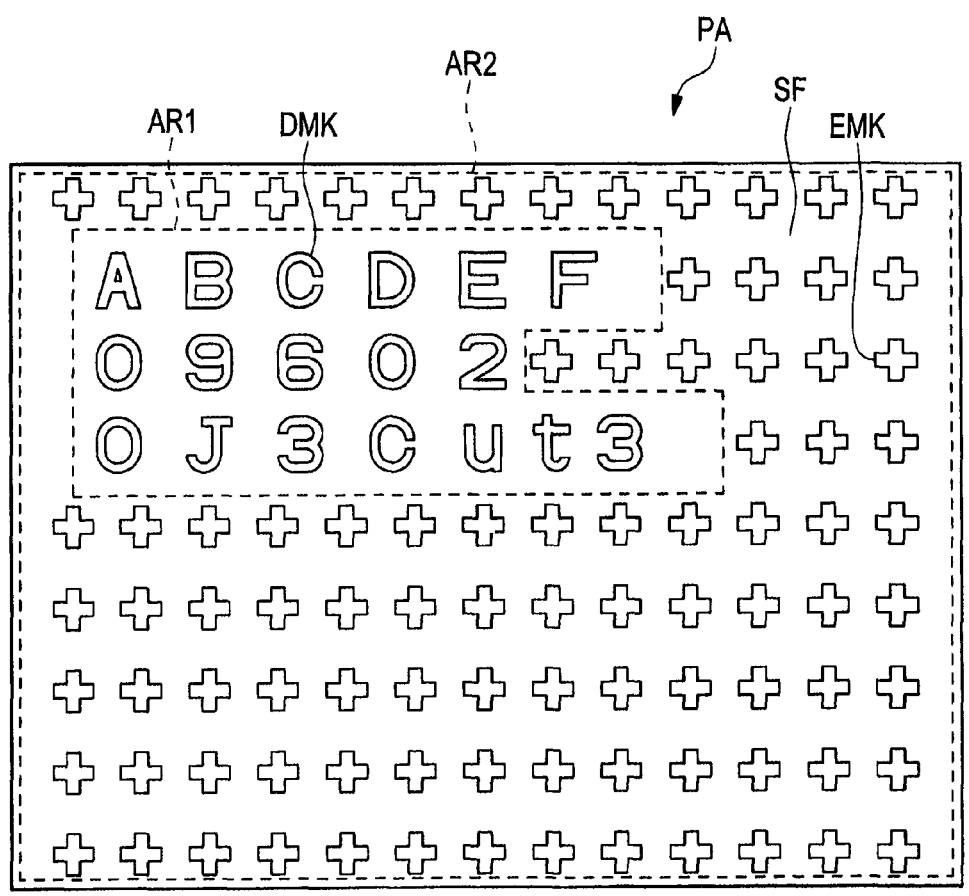
FIG. 10 is a plan view showing an outer appearance configuration of a power amplifying module in a second modification.

Next, a description will be given to another modification of the power amplifying module PA in the first embodiment. FIG. 10 is a plan view showing an outer appearance configuration of the power amplifying module PA in the second modification. As shown in FIG. 10, the power amplifying module PA in the second modification has a sealing body having a rectangular shape, and a shield film SF is formed over a surface of the sealing body. Also, in the surface of the sealing body, the product-identification-mark formation region AR1 and the peeling-prevention-mark formation region AR2 are present. In the product-identification-mark formation region AR1, the product identification marks DMK are formed. In the peeling-prevention-mark formation region AR2, the peeling prevention marks EMK are formed.

The characteristic feature of the second modification is that each of the peeling prevention marks EMK is formed of a cross pattern in the form of crossing lines. That is, in the first embodiment described above, each of the peeling prevention marks EMK is formed of the dot pattern in the form of a point but, as in the second modification, each of the peeling prevention marks EMK may also be formed of a cross pattern in the form of crossing lines. Briefly, to inhibit the peeling of the shield film SF from the surface of the sealing body, the technical idea of the present invention aims at reducing the planar regions existing in the surface of the sealing body. To attain the aim, in the present invention, the peeling prevention marks EMK each having the recessed shape are formed in the peeling-prevention-mark formation region AR2. What is important with regard to this feature is to provide the indented shape in the peeling-prevention-mark formation region AR2, and the shape of each of the peeling prevention marks EMK is not limited as long as it is recessed. That is, in the first embodiment described above, the description has been given to the example in which each of the peeling prevention marks EMK is formed of the dot pattern in the form of a point, but the technical idea of the present invention is not limited thereto. It may also be possible to form each of the peeling prevention marks EMK of the cross pattern in the form of crossing lines, as in the second modification, or of a pattern having another recessed shape (e.g., a circle, a rectangle, a line, or the like).

The configuration of the second modification is otherwise the same as in the first embodiment described above. That is, in the second modification also, the indented shape is formed not only in the product-identification-mark formation region AR1, but also in the peeling-prevention-mark formation region AR2. This can reduce the planar regions existing in the surface of the sealing body, and thereby suppress the first factor which is the air bubbles more likely to be attached to the sealing body when the sealing body is dipped in the plating solution and the second factor which is the anchor effect less likely to be produced. As a result, it is possible to inhibit the peeling portion (bulged portion) from being formed between the surface of the sealing body and the shield film SF. Therefore, according to the second modification also, it is possible to inhibit an outer appearance failure due to the peeling (bulging) of the shield film SF.

<Manufacturing Method of Power Amplifying Module>

The power amplifying module (semiconductor device) PA in the first embodiment is thus configured. A description will be given below to a manufacturing method thereof with reference to the drawings. First, for clear illustration of the manufacturing method of the power amplifying module PA in the first embodiment, a description will be given using a flow chart and a plan view. Then, the description will be given using a cross-sectional view.

Figure 11:
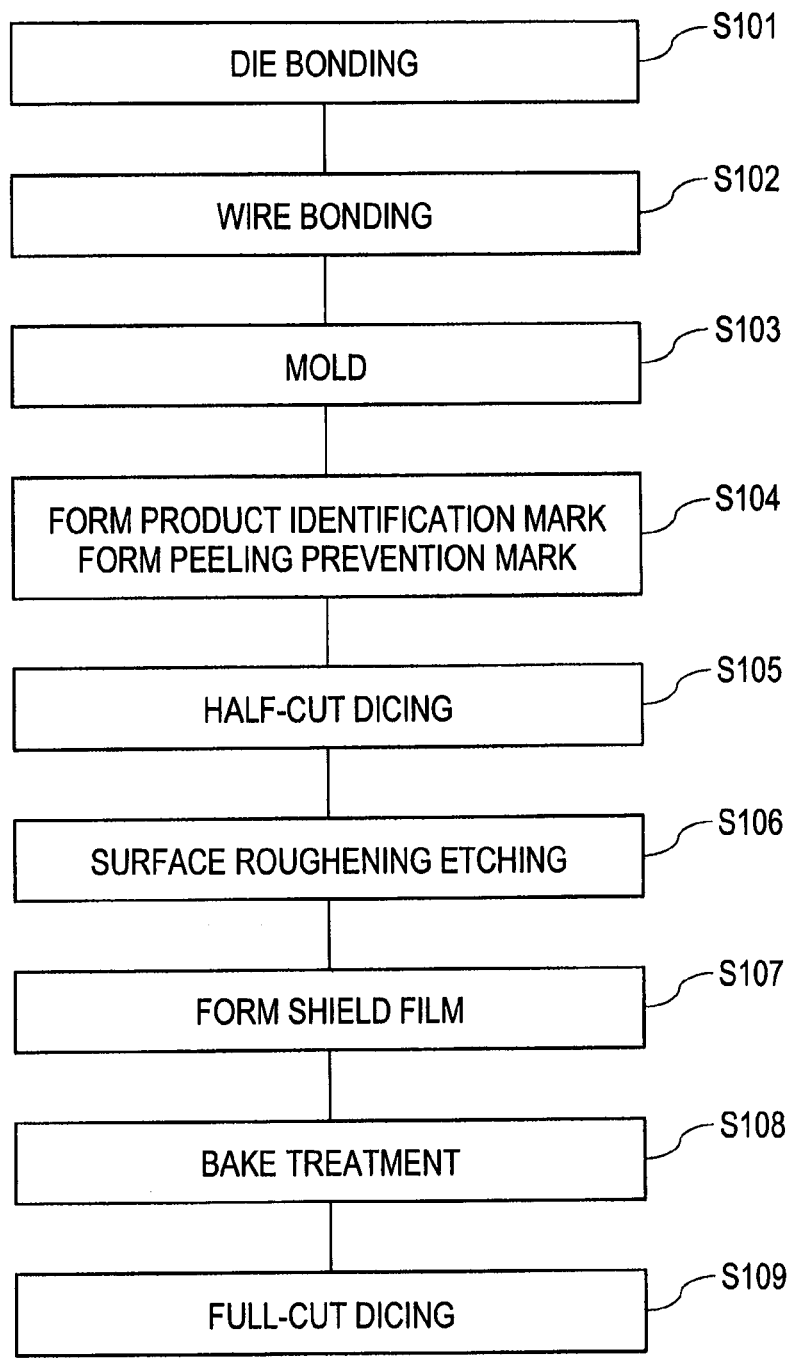
FIG. 11 is a flow chart showing the flow of the manufacturing steps of the power amplifying module in the first embodiment.
Figure 12:
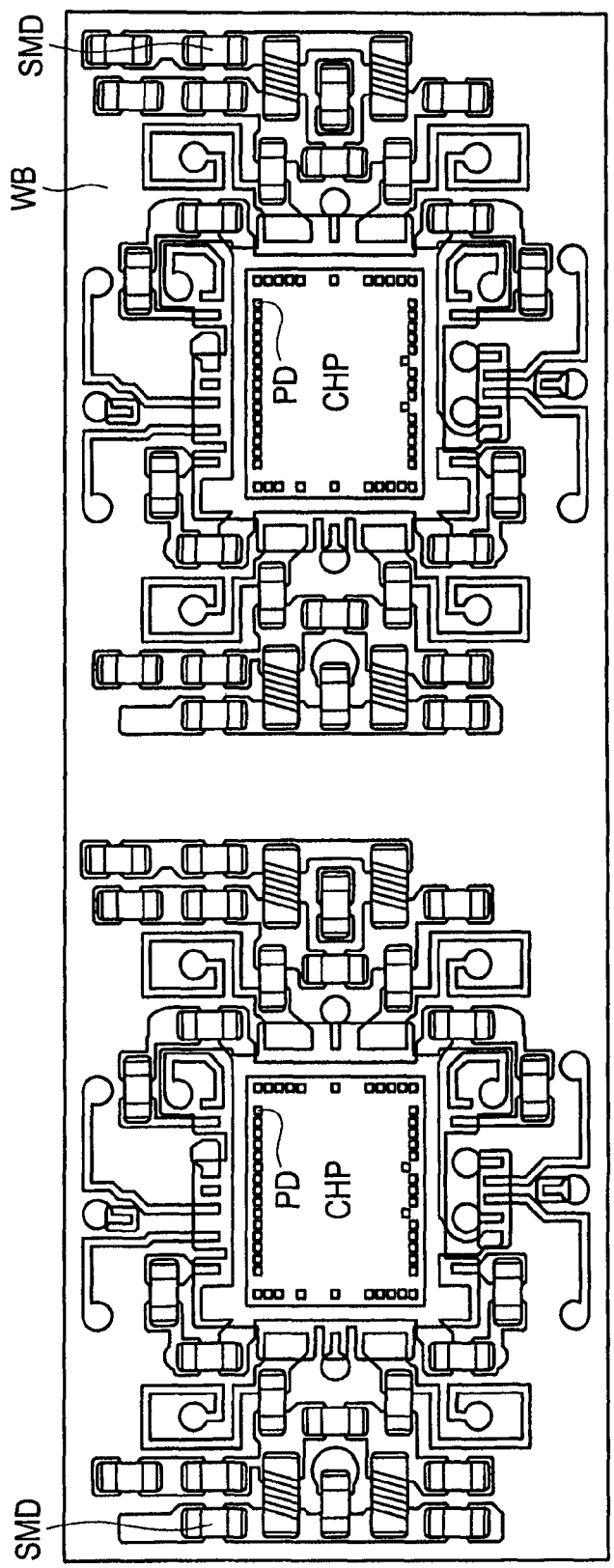
FIG. 12 is a plan view showing the manufacturing step of the power amplifying module in the first embodiment.

FIG. 11 is a flow chart showing the flow of the manufacturing steps of the power amplifying module in the first embodiment. As shown in FIG. 12, over the wiring board WB, the semiconductor chip CHP formed with, e.g., an LDMOS-FET is mounted (die bonding) (S101 of FIG. 11). Note that, over the wiring board WB, not only the semiconductor chip CHP, but also the passive components SMD including a resistive element, a capacitive element, and an inductive element are mounted.

Figure 13:
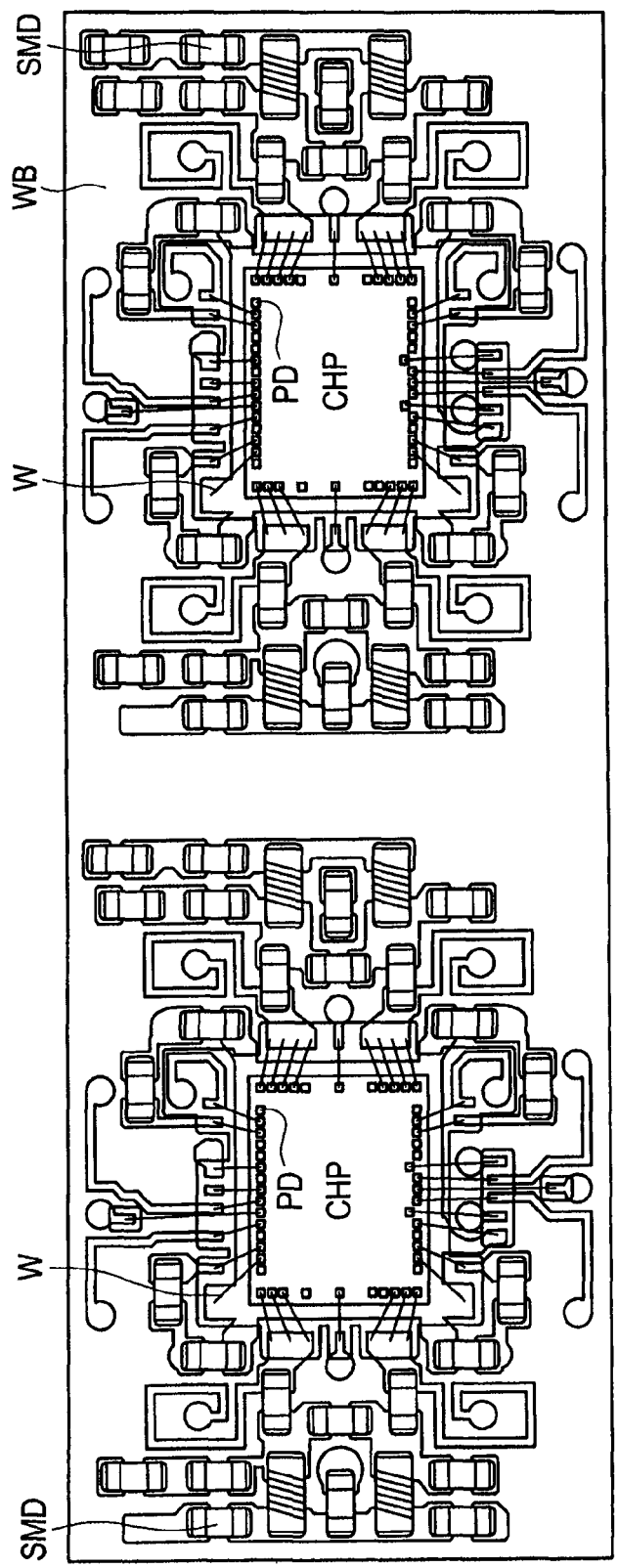
FIG. 13 is a plan view showing the manufacturing step of the power amplifying module, which is subsequent to FIG. 12.

Subsequently, as shown in FIG. 13, the pads PD formed over the surface of the semiconductor chip CHP mounted over the wiring board WB and the wiring pattern formed over the wiring board WB are coupled with the wires W comprised of, e.g., gold wires (wire bonding) (S102 of FIG. 11). Specifically, using a capillary (not shown), balls are compression bonded (first bonding) to the pads PD, and then the capillary is moved, while the gold wires (wires W) are pulled out. Then, by bonding (second bonding) the gold wires (wires W) to the wiring pattern (terminals and lands), the pads PD and the wiring pattern are electrically coupled with the wires W.

Figure 14:
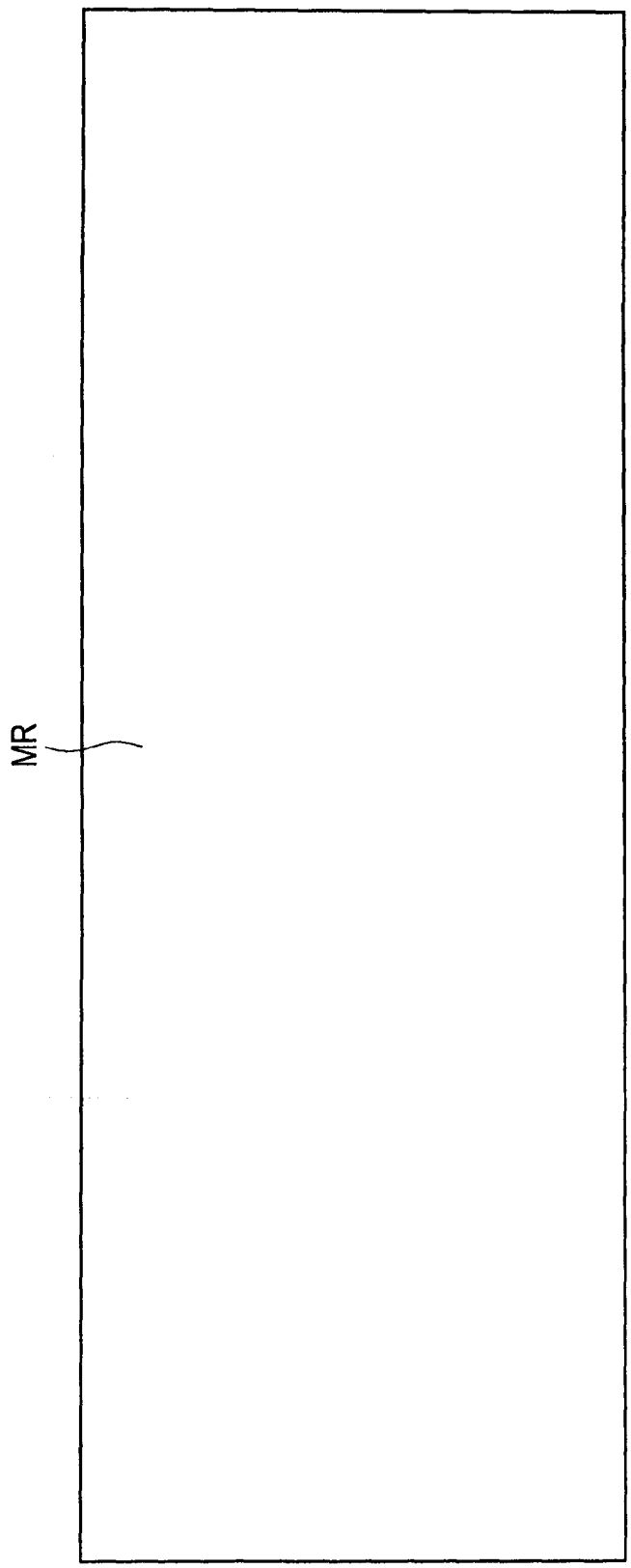
FIG. 14 is a plan view showing the manufacturing step of the power amplifying module, which is subsequent to FIG. 13.

Next, as shown in FIG. 14, the sealing body MR comprised of the epoxy resin (thermosetting resin) containing the filler is formed over the wiring board WB so as to cover the semiconductor chip CHP, the wires W, and the passive components SMD which are mounted over the wiring board WB (mold) (S103 of FIG. 11). Specifically, the wiring board WB over which the semiconductor chip CHP, the wires W, and the passive components SMD are mounted is sandwiched between an upper mold die and a lower mold die such that the semiconductor chip CHP, the wires W, and the passive components SMD are disposed in a cavity provided in the upper mold die. In this state, the epoxy resin is injected into the cavity described above to thereby form the sealing body over the wiring board WB.

Figure 15:
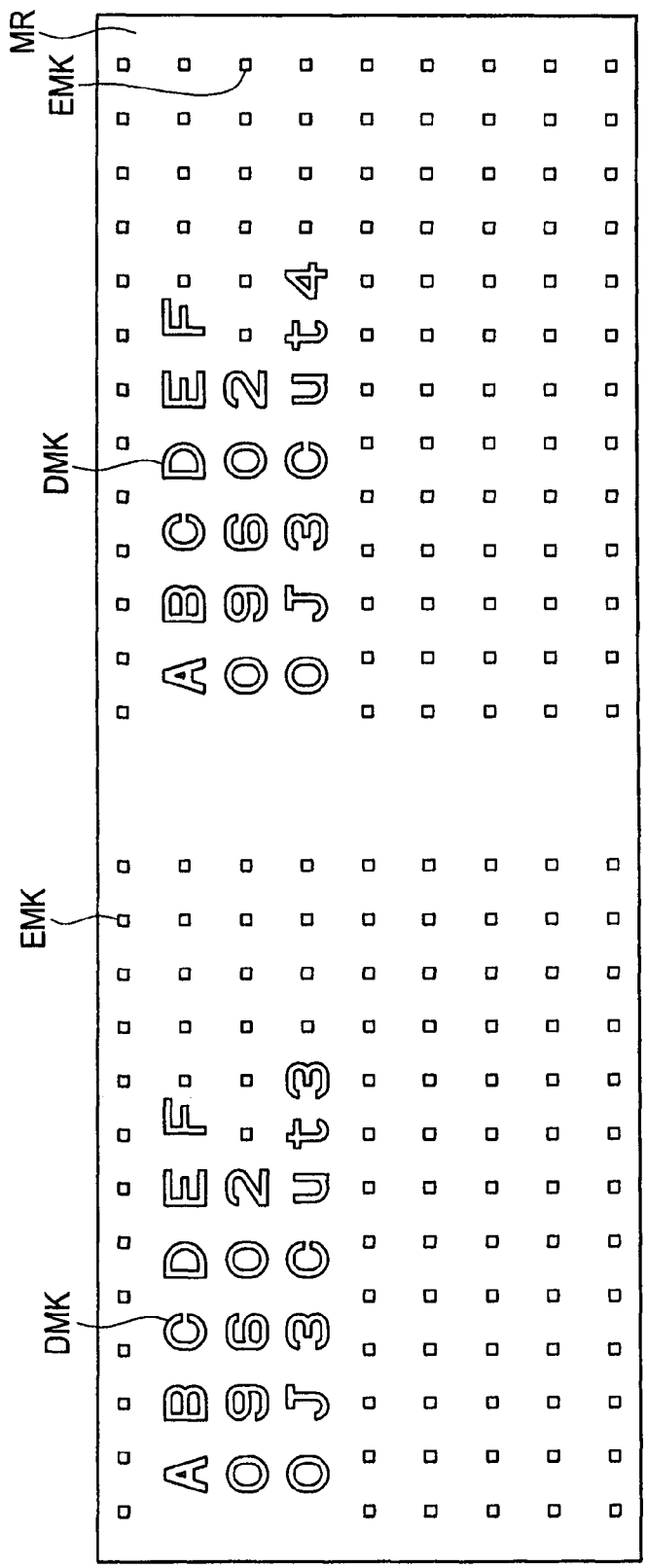
FIG. 15 is a plan view showing the manufacturing step of the power amplifying module, which is subsequent to FIG. 14.

Then, as shown in FIG. 15, the product identification marks DMK and the peeling prevention marks EMK are formed in the surface of the sealing body MR (S104 of FIG. 11). Specifically, by irradiating the surface of the sealing body MR with laser light to heat the surface of the sealing body MR irradiated with the laser light, the resin is evaporated so that the spots each having the recessed shape are formed in the surface of the sealing body. Then, by laser scanning, a large number of the spots are formed in the surface of the sealing body MR to form the product identification marks DMK comprised of the sequences of letters and numbers in the product-identification-mark formation region. Likewise, in this step, the peeling prevention marks EMK each comprised of the dot pattern are formed in the peeling-prevention-mark formation region. As a result, in the entire surface of the sealing body MR, the indented shape is formed. Thus, in the first embodiment, in the step of forming the product identification marks DMK in the product-identification-mark formation region, the peeling prevention marks EMK are also formed in the peeling-prevention-mark formation region. Accordingly, compared to the case where the product identification marks DMK and the peeling prevention marks EMK are formed in different steps, the manufacturing steps can be simplified.

Figure 16:
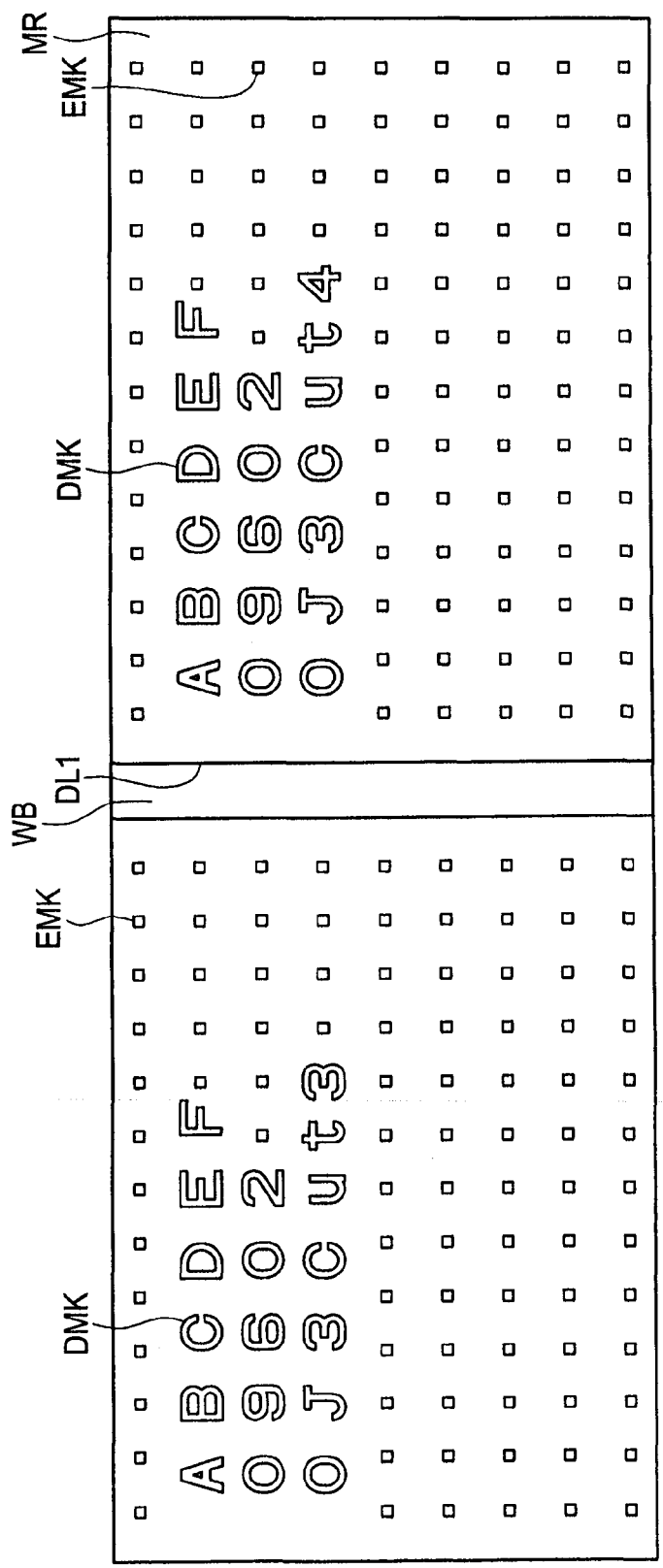
FIG. 16 is a plan view showing the manufacturing step of the power amplifying module, which is subsequent to FIG. 15.

Subsequently, as shown in FIG. 16, the sealing body MR and the wiring board WB are subjected to half-cut dicing (S105 of FIG. 11). In this manner, the sealing body MR is cut, and the wiring board WB is cut in the thickness direction thereof to a depth corresponding to about half the thickness of the wiring board WB so that a dicing line DL1 is formed.

Figure 17:
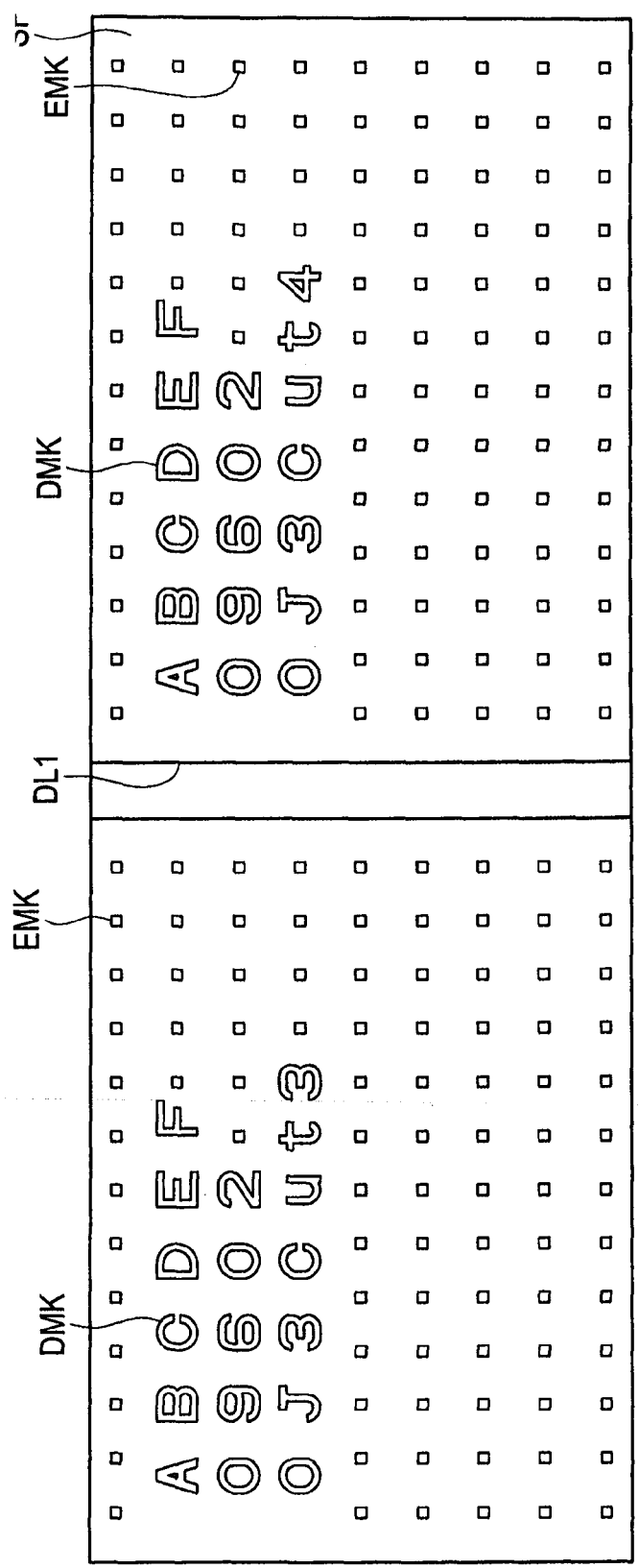
FIG. 17 is a plan view showing the manufacturing step of the power amplifying module, which is subsequent to FIG. 16.

Then, as shown in FIG. 17, the surface of the sealing body MR is subjected to a roughening etching treatment (S106 of FIG. 11). Additionally, from the bottom surface and side surfaces of the dicing line DL1, the shield film SF is formed over the entire surface of the sealing body MR (S107 of FIG. 11). Specifically, the shield film SF is formed of the multi-layer film of, e.g., a copper film and a nickel film, and formed by e.g., an electroless plating method. In the electroless plating method, the wiring board WB formed with the sealing body MR is dipped in a plating solution and, by a chemical reaction at the surface of the sealing body MR, the shield film SF is formed from the bottom surface and side surfaces of the dicing line DL1 over the entire surface of the sealing body MR. When the wiring board WB formed with the sealing body MR is dipped in the plating solution, air may be contained therein. However, in the first embodiment, the product identification marks DMK and the peeling prevention marks EMK, each having the recessed shape, are formed in the surface of the sealing body MR so that the areas of the planar regions to which air bubbles are likely to attach are reduced. Accordingly, air bubbles having relatively large sizes are less likely to be attached to the surface of the sealing body MR and, even if air bubbles are attached to the surface of the sealing body MR, the sizes of the air bubbles are small. After the shield film SF is formed, the wiring board WB is subjected to the bake treatment (heat treatment) (S108 of FIG. 11). However, even when the attached air bubbles expand between the surface of the sealing body MR and the shield film SF due to a thermal load, since the sizes thereof are small, the peeling of the shield film SF from the surface of the sealing body MR can be inhibited. In particular, in the first embodiment, the product identification mark DMK and the peeling prevention marks EMK, each having the recessed shape, are formed in the surface of the sealing body MR so that the adhesion between the sealing body MR and the shield film SF has been improved by the anchor effect. From this viewpoint also, according to the first embodiment, the peeling of the shield film SF from the surface of the sealing body MR can be effectively suppressed.

Figure 18:
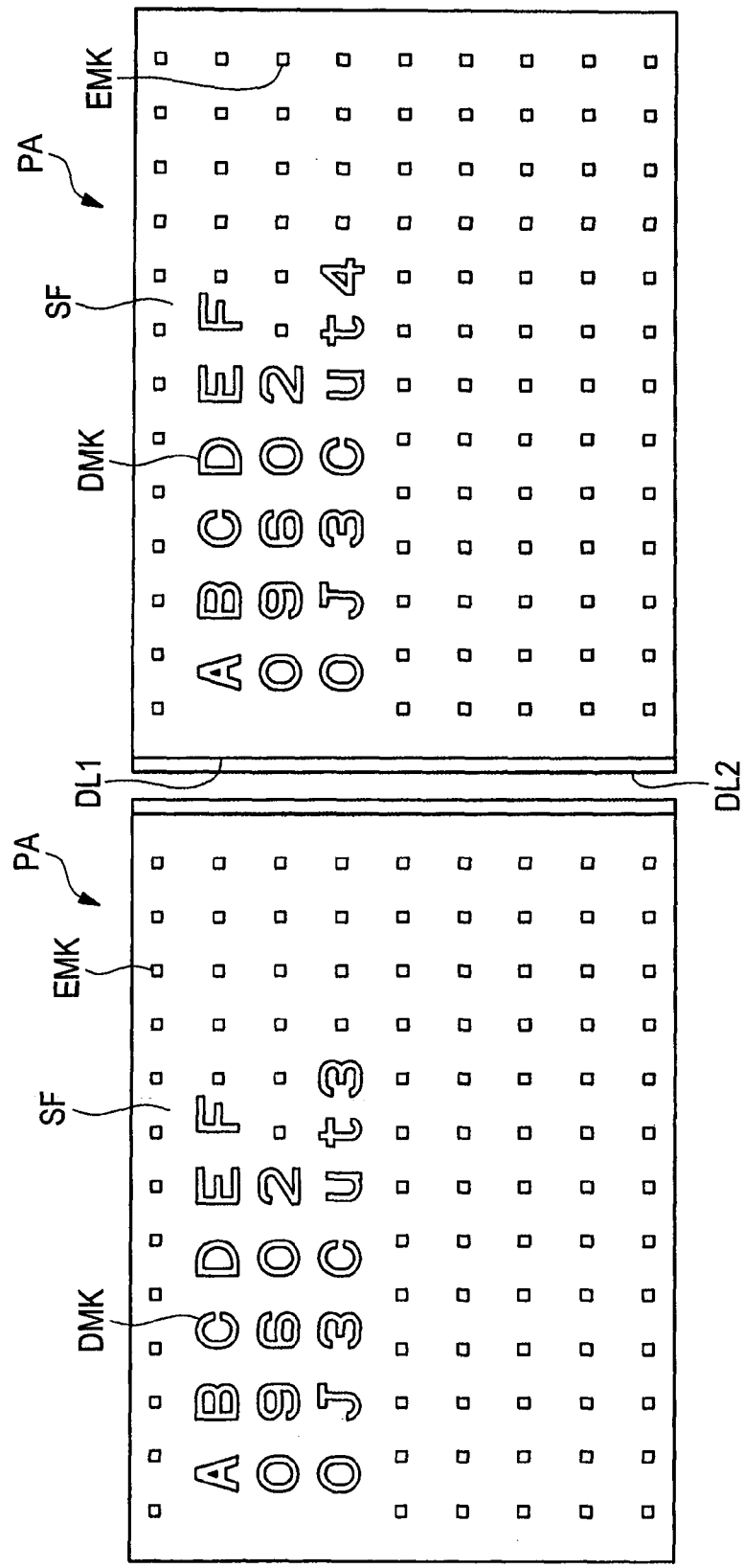
FIG. 18 is a plan view showing the manufacturing step of the power amplifying module, which is subsequent to FIG. 17.

Next, as shown in FIG. 18, the wiring board WB is subjected to full-cut dicing to be completely cut (S109 of FIG. 11). At this time, the width of a dicing line DL2 formed at this time is smaller than the width of the dicing line DL1 formed in the half-cut dicing. Thus, the power amplifying module PA according to the first embodiment can be manufactured.

Figure 19:
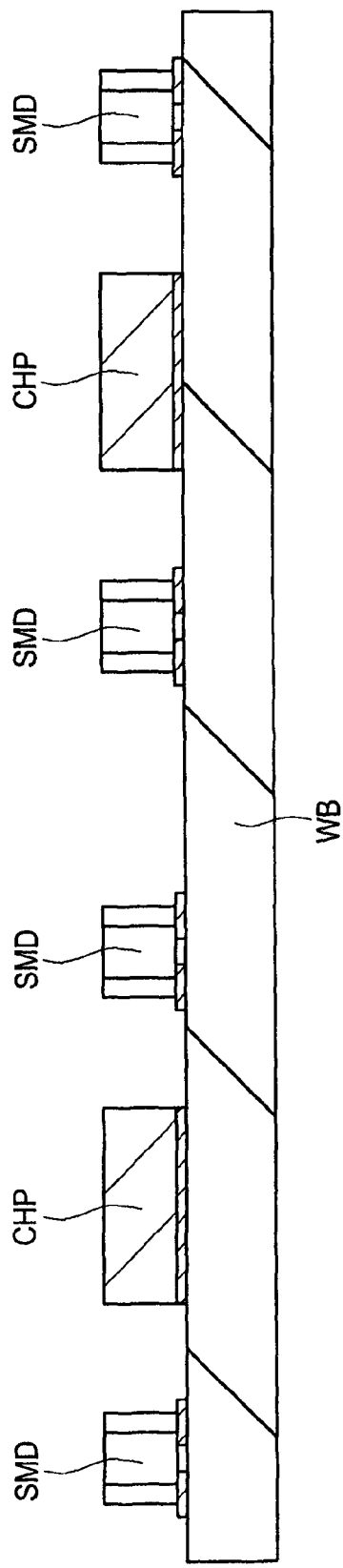
FIG. 19 is a cross-sectional view showing the manufacturing step of the power amplifying module in the first embodiment.

The manufacturing steps of the power amplifying module PA in the first embodiment will be further described using a cross-sectional view. As shown in FIG. 19, the plurality of semiconductor chips CHP and the plurality of passive components SMD are mounted over the upper surface (surface) of the wiring board WB. The wiring board WB at this stage is a multi-piece board from which a plurality of power amplifying modules can be simultaneously formed.

Figure 20:
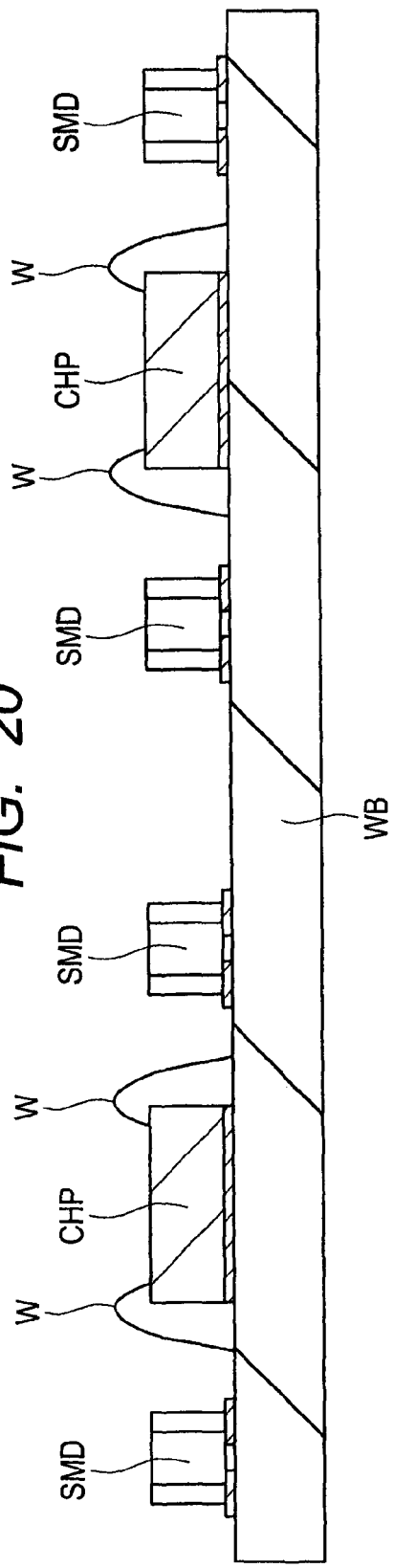
FIG. 20 is a cross-sectional view showing the manufacturing step of the power amplifying module, which is subsequent to FIG. 19.
Figure 21:
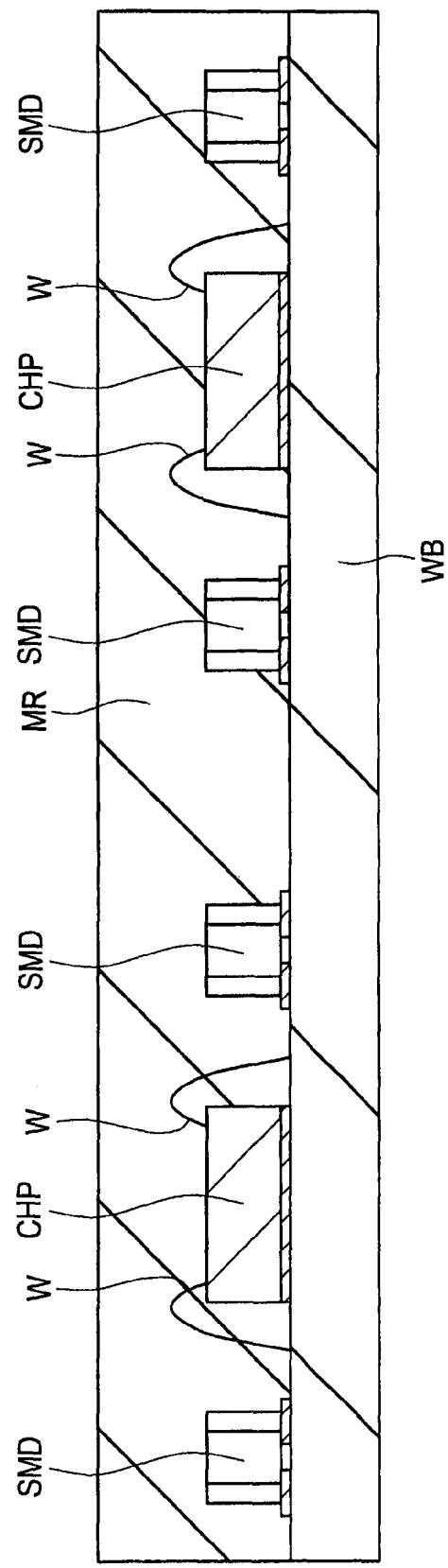
FIG. 21 is a cross-sectional view showing the manufacturing step of the power amplifying module, which is subsequent to FIG. 20.

Subsequently, as shown in FIG. 20, each of the semiconductor chips CHP mounted over the wiring board WB and the terminals (wiring pattern) formed over the wiring board WB are electrically coupled with the wires W comprised of gold wires. Then, as shown in FIG. 21, the sealing body MR is formed so as to cover the semiconductor chips CHP, the wires W, and the passive components SMD.

Figure 22:
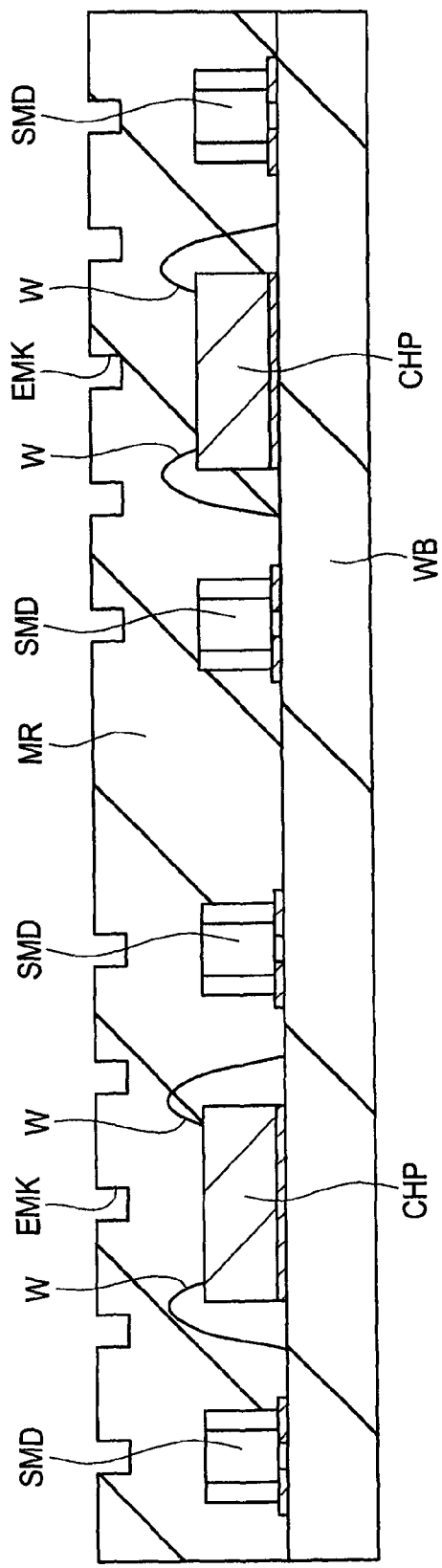
FIG. 22 is a cross-sectional view showing the manufacturing step of the power amplifying module, which is subsequent to FIG. 21.

Next, as shown in FIG. 22, the product identification mark DMK (not shown) and the peeling prevention marks EMK are formed in the surface of the sealing body MR by laser marking. In FIG. 22, the recessed shapes forming the peeling prevention marks EMK are shown. Thus, according to the first embodiment, it is possible to form the entire surface of the sealing body MR into the indented shape.

Figure 23:
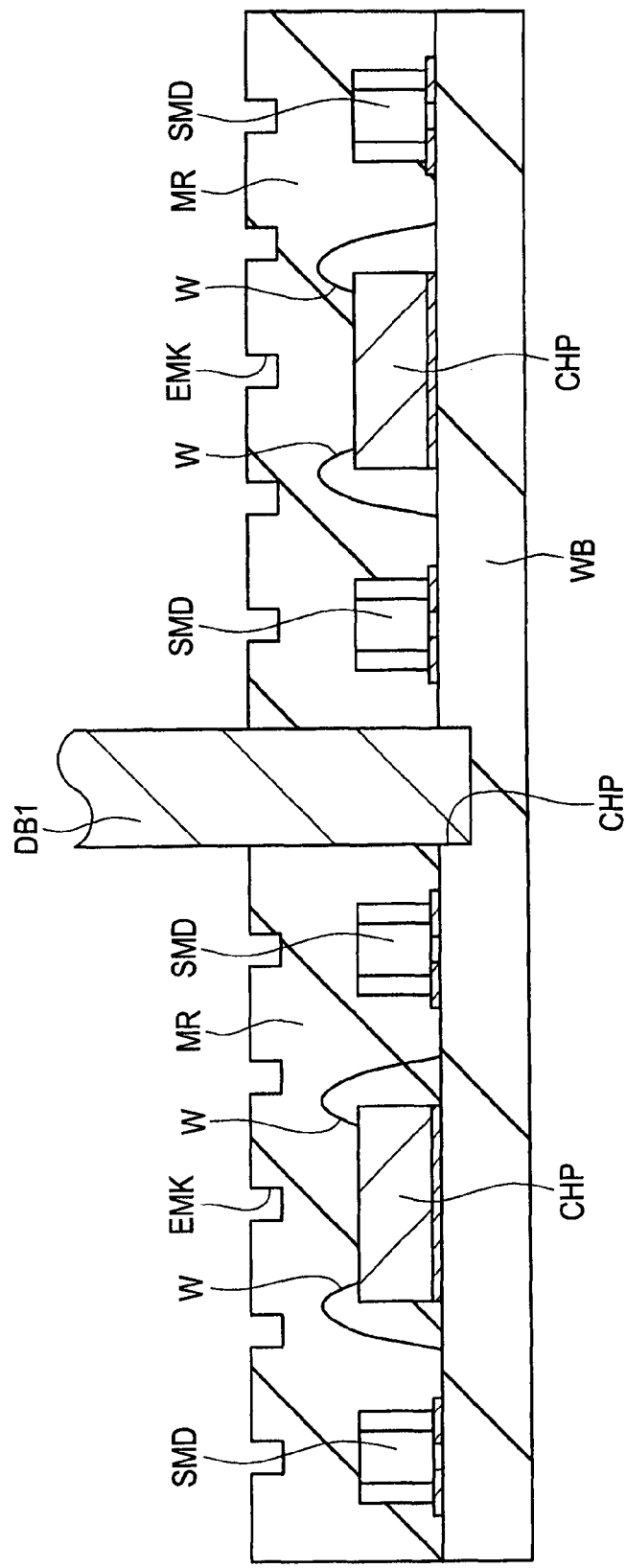
FIG. 23 is a cross-sectional view showing the manufacturing step of the power amplifying module, which is subsequent to FIG. 22.

Then, as shown in FIG. 23, by half-cut dicing using a blade DB1, the sealing body MR is cut, while the wiring board WB is partially cut in the thickness direction. The wiring board WB is thus subjected to halfway dicing to expose the reference wiring line formed in the wiring board from the side surfaces of the wiring board WB.

Figure 24:
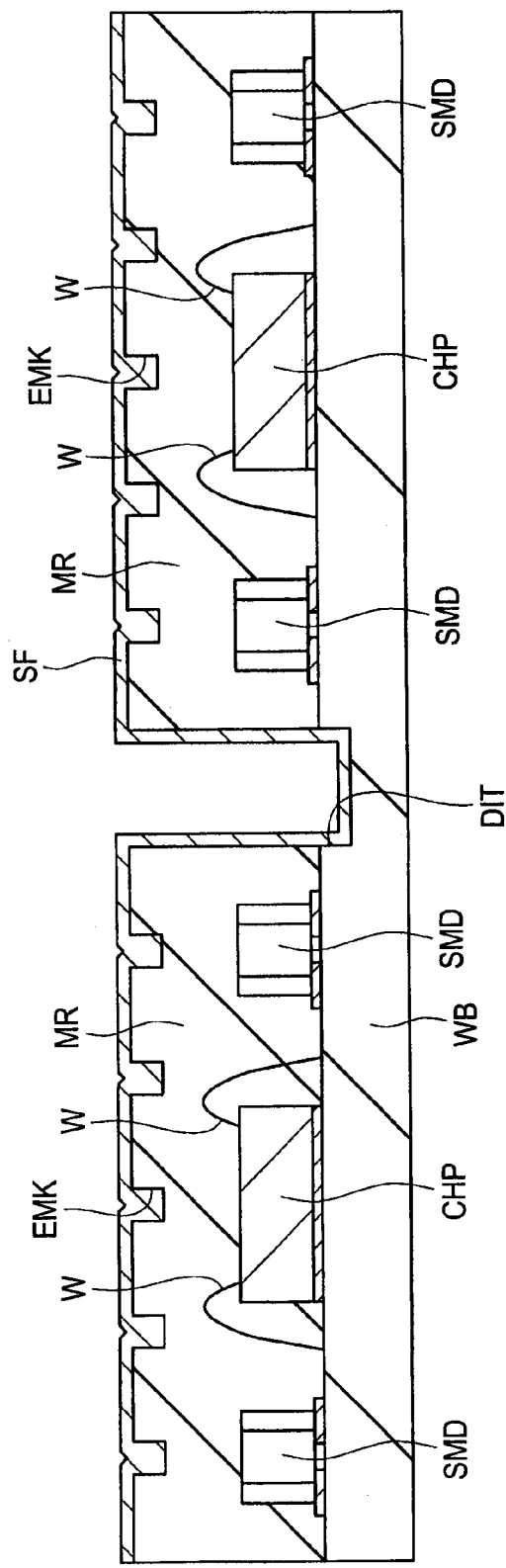
FIG. 24 is a cross-sectional view showing the manufacturing step of the power amplifying module, which is subsequent to FIG. 23.

Subsequently, as shown in FIG. 24, the surface of the sealing body MR is subjected to the roughening etching treatment. Then, over the surface of the sealing body MR including the inner walls of a trench DIT formed by performing half-cut dicing, the shield film SF is formed. At this time, at the side surfaces of the trench DIT, the reference wiring line formed in the wiring board WB is exposed so that the shield film SF is formed so as to be electrically coupled to the reference wiring line.

Here, the shield film SF is formed by, e.g., an electroless plating method so that, when the wiring board WB formed with the sealing body MR is dipped in a plating solution, air may be contained therein. However, in the first embodiment, the product identification marks and the peeling prevention marks EMK, each having the recessed shape, are formed in the surface of the sealing body MR so that the areas of the planar regions to which air bubbles are likely to attach are reduced. Accordingly, air bubbles having relatively large sizes are less likely to be attached to the surface of the sealing body MR and, even if air bubbles are attached to the surface of the sealing body MR, the sizes of the air bubbles are small. After the shield film SF is formed, the wiring board WB is subjected to the bake treatment (heat treatment). However, even when the attached air bubbles expand between the surface of the sealing body MR and the shield film SF due to a thermal load, since the sizes thereof are small, the peeling of the shield film SF from the surface of the sealing body MR can be inhibited. In particular, in the first embodiment, the product identification marks and the peeling prevention marks EMK, each having the recessed shape, are formed in the surface of the sealing body MR so that the adhesion between the sealing body MR and the shield film SF has been improved by the anchor effect. From this viewpoint also, according to the first embodiment, the peeling of the shield film SF from the surface of the sealing body MR can be effectively suppressed.

Figure 25:
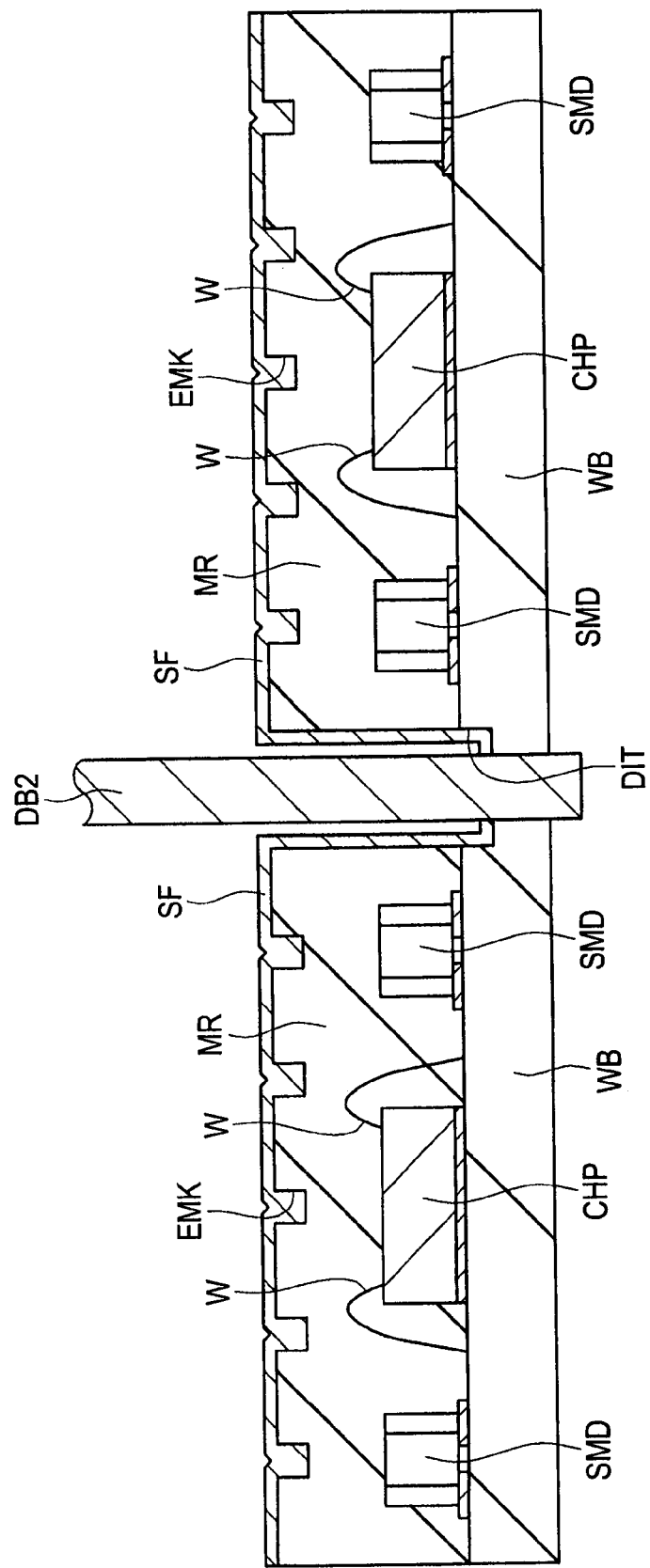
FIG. 25 is a cross-sectional view showing the manufacturing step of the power amplifying module, which is subsequent to FIG. 24.
Figure 26:
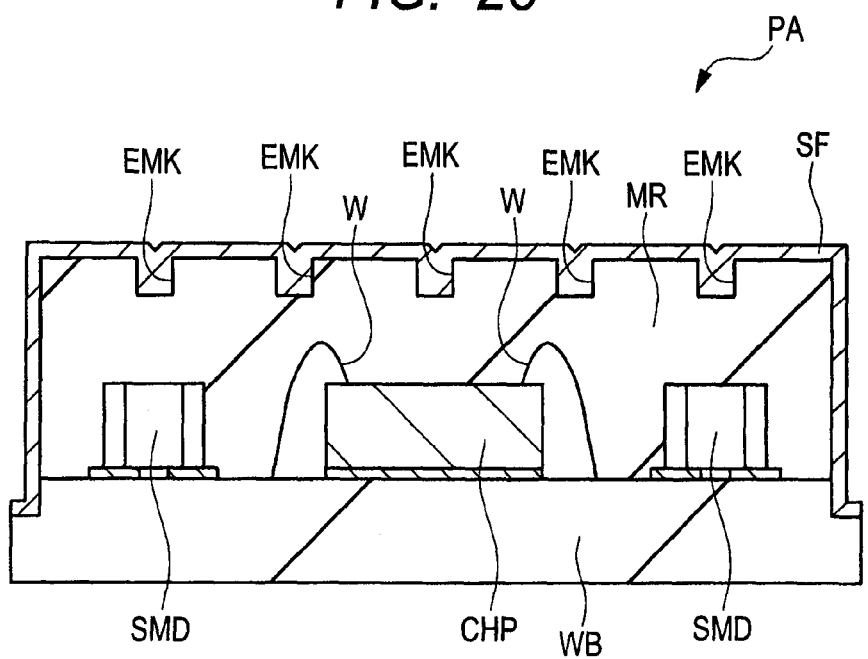
FIG. 26 is a cross-sectional view showing the manufacturing step of the power amplifying module, which is subsequent to FIG. 25.

Next, as shown in FIG. 25, using a blade DB2 having a width smaller than that of the blade DB1, the wiring board WB is subjected to full-cut dicing. As a result, as shown in FIG. 26, the wiring board WB is divided into separate pieces so that the individual power amplifying modules PA are manufactured. In this manner, the power amplifying modules according to the first embodiment can be manufactured.

Second Embodiment

In the first embodiment described above, the description has been given to the example in which the peeling prevention marks EMK are formed by irradiating the surface of the sealing body MR with laser light. However, in a second embodiment, a description will be given to an example in which the peeling prevention marks EMK are formed by providing protruding portions PRU in a surface of an upper mold die used when the sealing body MR is formed.

Note that a structure of a power amplifying module according to the second embodiment is the same as that of the power amplifying module PA according to the first embodiment described above. The power amplifying module according to the second embodiment is different from the power amplifying module PA according to the first embodiment in the manufacturing steps thereof. Therefore, a description will be given below to a characteristic feature of a manufacturing method of the power amplifying module according to the second embodiment.

Figure 27:
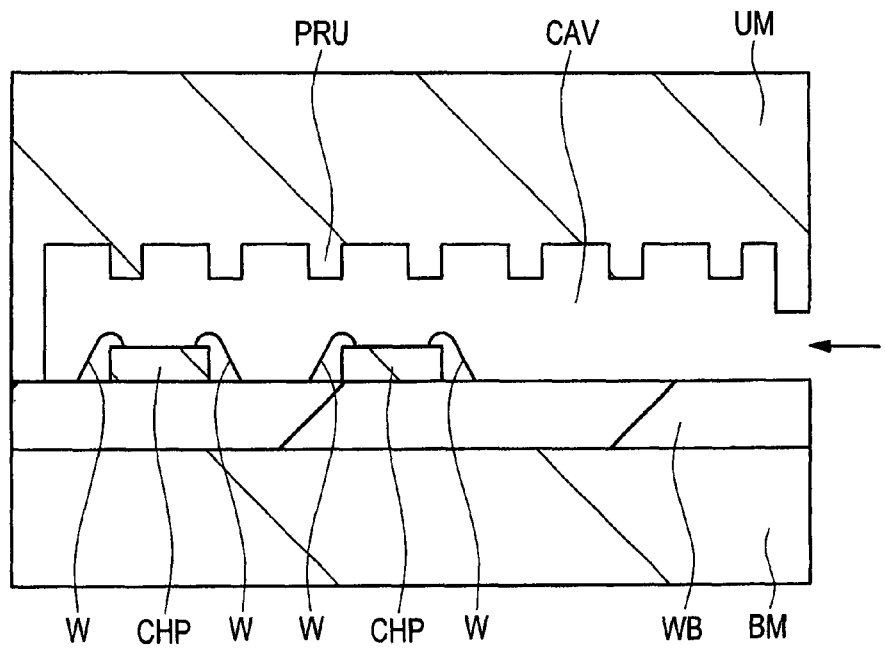
FIG. 27 is a cross-sectional view showing the manufacturing step of a power amplifying module in a second embodiment.

FIG. 27 is a cross-sectional view showing a state where the wiring board WB over which the semiconductor chip CHP is mounted is sandwiched between an upper mold die UM and a lower mold die BM. In FIG. 27, the semiconductor chip CHP mounted over the wiring board WB is disposed in a cavity CAV formed between the wiring board WB and the upper mold die UM. Here, the second embodiment is characterized in that the plurality of protruding portions PRU are provided in the upper mold die UM. In this state, when a resin is injected in the direction indicated by the arrow of FIG. 27, the sealing body MR of FIG. 28 is obtained.

Figure 28:
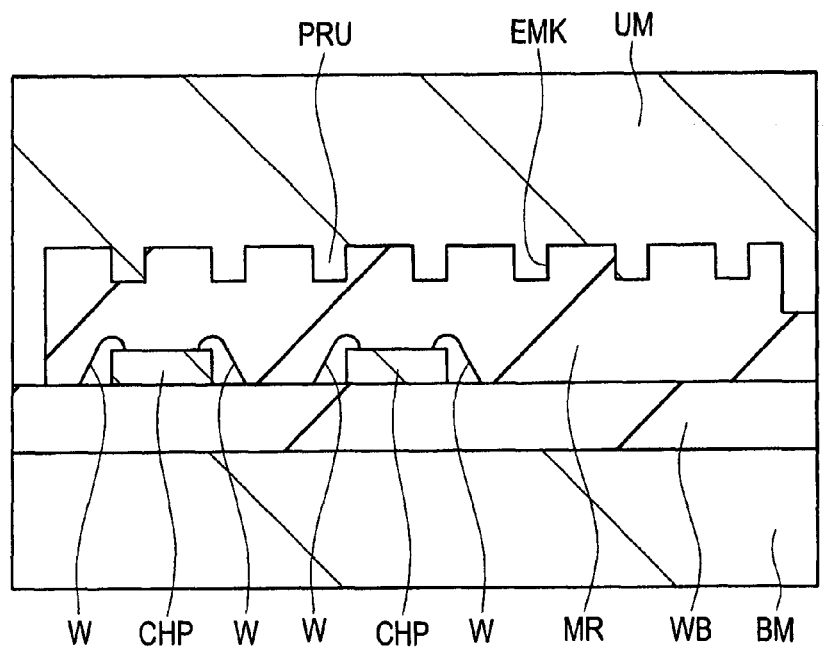
FIG. 28 is a cross-sectional view showing the manufacturing step of the power amplifying module, which is subsequent to FIG. 27.

FIG. 28 is a cross-sectional view showing the state of the sealing body MR formed by injecting the resin into the cavity CAV formed when the wiring board WB is sandwiched between the upper mold die UM and the lower mold die BM. As shown in FIG. 28, in the surface of the sealing body MR, the peeling prevention marks EMK having recessed shapes reflecting the shapes of the protruding portions PRU of the upper mold die UM are formed. Thus, in the second embodiment also, the peeling prevention marks EMK having the recessed shapes can be formed in the surface of the sealing body MR. Therefore, from the power amplifying module according to the second embodiment also, the same effects as obtained from the power amplifying module PA according to the first embodiment described above can be obtained. That is, in the power amplifying module according to the second embodiment also, an indented shape is formed not only in a product-identification-mark formation region, but also in a peeling-prevention-mark formation region. This can reduce the planar regions existing in the surface of the sealing body, and thereby suppress the first factor which is the air bubbles more likely to be attached to the sealing body when the sealing body is dipped in the plating solution and the second factor which is the anchor effect less likely to be produced. As a result, it is possible to inhibit the peeling portion (bulged portion) from being formed between the surface of the sealing body and the shield film SF. Therefore, in the second embodiment also, it is possible to inhibit an outer appearance failure due to the peeling (bulging) of the shield film SF.

While the invention achieved by the present inventors has been specifically described heretofore based on the embodiment thereof, the present invention is not limited thereto. It will be appreciated that various changes and modifications can be made in the invention within the scope not departing from the gist thereof.

The present invention is widely applicable to a manufacturing industry for manufacturing a semiconductor device.

What is claimed is:

1. A semiconductor device, comprising:
    (a) a wiring board;
    (b) a semiconductor chip mounted over the wiring board;
    (c) a sealing body formed over the wiring board so as to cover the semiconductor chip; and
    (d) a shield film formed over a surface of the sealing body and electrically coupled to a reference wiring line formed over the wiring board to supply a reference potential,
    wherein the surface of the sealing body is formed with a product identification mark having a recessed shape for identification of a product and a plurality of peeling prevention marks, each having a recessed shape, for preventing the shield film from peeling from the surface of the sealing body,
    wherein a product-identification-mark formation region where the product identification mark is disposed and a peeling-prevention-mark formation region where the peeling prevention marks are disposed are different regions, and
    wherein the peeling-prevention-mark formation region is formed so as to surround the product-identification-mark formation region when viewed in plan view.

2. A semiconductor device according to claim 1,
    wherein a depth of the product identification mark is the same as a depth of the peeling prevention marks.

3. A semiconductor device according to claim 1,
    wherein the peeling prevention marks are formed of a plurality of identical patterns.

4. A semiconductor device according to claim 3,
    wherein the product identification mark is formed of an identification pattern including a plurality of sequences of letters and numbers, and
    wherein a pitch distance of the identical patterns forming the peeling prevention marks is the same as a minimum pitch distance in the identification pattern forming the product identification mark.

5. A semiconductor device according to claim 3,
    wherein the product identification mark is formed of an identification pattern including a plurality of sequences of letters and numbers, and
    wherein the number of the identical patterns forming the peeling prevention marks is larger than the number of the sequences of letters and numbers forming the identification pattern.

6. A semiconductor device according to claim 3,
    wherein the product identification mark is formed of an identification pattern including a plurality of sequences of letters and numbers, and wherein the number of the identical patterns forming the peeling prevention marks is smaller than the number of the sequences of letters and numbers forming the identification pattern.

7. A semiconductor device according to claim 1, wherein the peeling prevention marks are formed of dot patterns each in the form of a point.

8. A semiconductor device according to claim 1, wherein the peeling prevention marks are formed of cross patterns each in the form of crossing lines.

9. A semiconductor device according to claim 1, wherein the shield film is formed of a plating film.

10. A semiconductor device according to claim 9, wherein the shied film is formed of a copper film, and a nickel film formed over the copper film.

11. A semiconductor device according to claim 1, wherein the sealing body is formed of a resin containing a filler.

12. A semiconductor device according to claim 1, wherein the peeling-prevention-mark formation region is formed so as to surround the product-identification-mark formation region on at least three sides when viewed in the plan view.

* * * * *